United States Patent
Rajashekhar et al.

(10) Patent No.: US 11,424,265 B2
(45) Date of Patent: *Aug. 23, 2022

(54) THREE-DIMENSIONAL MEMORY DEVICE HAVING AN EPITAXIAL VERTICAL SEMICONDUCTOR CHANNEL AND METHOD FOR MAKING THE SAME

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Fei Zhou, San Jose, CA (US); Rahul Sharangpani, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/004,811

(22) Filed: Aug. 27, 2020

(65) Prior Publication Data
US 2020/0395380 A1 Dec. 17, 2020

Related U.S. Application Data

(63) Continuation of application No. 16/290,277, filed on Mar. 1, 2019, now Pat. No. 10,790,300.

(51) Int. Cl.
*H01L 21/00* (2006.01)
*H01L 27/11582* (2017.01)
(Continued)

(52) U.S. Cl.
CPC .. *H01L 27/11582* (2013.01); *H01L 27/11573* (2013.01); *H01L 27/11575* (2013.01); *H01L 27/1157* (2013.01); *H01L 27/11565* (2013.01)

(58) Field of Classification Search
CPC ......... H01L 27/11582; H01L 27/11573; H01L 27/11575
See application file for complete search history.

(56) References Cited

U.S. PATENT DOCUMENTS

| 5,137,836 A | 8/1992 | Lam |
| 8,823,076 B2 * | 9/2014 | Lee .................. H01L 27/11526 257/321 |

(Continued)

FOREIGN PATENT DOCUMENTS

| CN | 110914988 A | 3/2020 |
| CN | 113228234 A | 8/2021 |

(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

(Continued)

*Primary Examiner* — Laura M Menz
(74) *Attorney, Agent, or Firm* — The Marbury Law Group PLLC

(57) ABSTRACT

A semiconductor structure includes a memory die bonded to a support die. The memory die includes an alternating stack of insulating layers and electrically conductive layers located over a substrate including a single crystalline substrate semiconductor material, and memory stack structures extending through the alternating stack and containing a respective memory film and a respective vertical semiconductor channel including a single crystalline channel semiconductor material. The support die contains a peripheral circuitry.

16 Claims, 25 Drawing Sheets

(51) Int. Cl.
  *H01L 27/11573* (2017.01)
  *H01L 27/11575* (2017.01)
  *H01L 27/11565* (2017.01)
  *H01L 27/1157* (2017.01)

(56) References Cited

U.S. PATENT DOCUMENTS

| | | | | |
|---|---|---|---|---|
| 8,878,278 | B2* | 11/2014 | Alsmeier | H01L 29/66833 257/314 |
| 8,884,357 | B2* | 11/2014 | Wang | H01L 27/115 257/324 |
| 8,946,023 | B2* | 2/2015 | Makala | H01L 27/11556 438/261 |
| 9,230,980 | B2 | 1/2016 | Rabkin et al. | |
| 9,331,090 | B2* | 5/2016 | Alsmeier | H01L 27/11582 |
| 9,443,865 | B2 | 9/2016 | Rabkin et al. | |
| 9,449,982 | B2* | 9/2016 | Lu | H01L 21/0337 |
| 9,515,080 | B2* | 12/2016 | Takahashi | H01L 27/11563 |
| 9,520,406 | B2* | 12/2016 | Makala | H01L 27/11556 |
| 9,530,790 | B1* | 12/2016 | Lu | H01L 27/11575 |
| 9,620,514 | B2* | 4/2017 | Kai | H01L 27/11519 |
| 9,627,395 | B2 | 4/2017 | Zhang et al. | |
| 9,698,153 | B2* | 7/2017 | Liu | H01L 27/11524 |
| 9,917,093 | B2* | 3/2018 | Chu | H01L 27/11575 |
| 10,103,161 | B2* | 10/2018 | Ito | H01L 29/0649 |
| 10,121,794 | B2 | 11/2018 | Gunhi-Yoneoka et al. | |
| 10,224,372 | B2* | 3/2019 | Mori | H01L 45/144 |
| 10,355,015 | B2* | 7/2019 | Zhang | G11C 16/0483 |
| 10,438,964 | B2* | 10/2019 | Makala | H01L 29/0847 |
| 10,510,738 | B2* | 12/2019 | Kim | H01L 24/08 |
| 2013/0248974 | A1* | 9/2013 | Alsmeier | H01L 29/788 257/321 |
| 2014/0217491 | A1* | 8/2014 | Lee | G11C 16/26 257/321 |
| 2014/0264525 | A1* | 9/2014 | Takahashi | H01L 27/11563 257/314 |
| 2014/0273373 | A1* | 9/2014 | Makala | H01L 21/8221 438/270 |
| 2014/0284697 | A1* | 9/2014 | Wang | H01L 29/66833 257/324 |
| 2015/0037950 | A1* | 2/2015 | Alsmeier | H01L 29/66825 438/258 |
| 2015/0118811 | A1* | 4/2015 | Makala | H01L 29/66833 438/270 |
| 2015/0235988 | A1 | 8/2015 | Ray et al. | |
| 2015/0294978 | A1* | 10/2015 | Lu | H01L 21/31144 438/269 |
| 2016/0079164 | A1 | 3/2016 | Fukuzumi et al. | |
| 2016/0086969 | A1* | 3/2016 | Zhang | H01L 21/02365 257/314 |
| 2016/0118397 | A1 | 4/2016 | Koka et al. | |
| 2016/0204117 | A1* | 7/2016 | Liu | H01L 27/11551 257/324 |
| 2016/0268209 | A1* | 9/2016 | Pachamuthu | H01L 29/40117 |
| 2017/0373078 | A1* | 12/2017 | Chu | H01L 27/1157 |
| 2017/0373087 | A1* | 12/2017 | Ito | H01L 27/11573 |
| 2018/0331118 | A1* | 11/2018 | Amano | H01L 21/76858 |
| 2018/0374866 | A1* | 12/2018 | Makala | H01L 21/31122 |
| 2019/0221557 | A1* | 7/2019 | Kim | H01L 27/11582 |
| 2020/0194445 | A1 | 6/2020 | Sharangpani et al. | |
| 2020/0279862 | A1 | 9/2020 | Rajashekhar et al. | |
| 2020/0286909 | A1 | 9/2020 | Yuda et al. | |
| 2020/0335487 | A1 | 10/2020 | Rajashekhar et al. | |
| 2020/0335516 | A1 | 10/2020 | Rajashekhar et al. | |
| 2020/0388626 | A1 | 12/2020 | Baraskar et al. | |
| 2021/0074672 | A1 | 3/2021 | Matsuo et al. | |
| 2021/0082865 | A1 | 3/2021 | Baraskar et al. | |
| 2021/0091063 | A1 | 3/2021 | Ninomiya et al. | |
| 2021/0355965 | A1 | 11/2021 | De Raeve et al. | |
| 2021/0408032 | A1 | 12/2021 | Baraskar et al. | |
| 2022/0045087 | A1 | 2/2022 | Baraskar et al. | |

FOREIGN PATENT DOCUMENTS

| | | |
|---|---|---|
| CN | 113571492 A | 10/2021 |
| TW | 202111876 A | 3/2021 |
| TW | 202118020 A | 5/2021 |
| WO | WO2016200742 A1 | 12/2016 |
| WO | WO2017034646 A1 | 3/2017 |
| WO | WO2019143400 A1 | 7/2019 |
| WO | WO2020180358 A1 | 9/2020 |
| WO | WO2020180362 A1 | 9/2020 |
| WO | WO2021040809 A1 | 3/2021 |
| WO | WO2021262249 A1 | 12/2021 |
| WO | WO2022031354 A1 | 2/2022 |

OTHER PUBLICATIONS

Notification of Transmittal of the International Search Report and Written Opinion of the international Search Authority for International Patent Application No. PCT/US2019/063567, dated Mar. 30, 2020, 13 pages.
U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 16/241,171, filed Jan. 7, 2019, SanDisk Technologies LLC.
U.S. Appl. No. 16/241,221, filed Jan. 7, 2019, SanDisk Technologies LLC.
U.S. Appl. No. 16/242,216, filed Jan. 8, 2019, SanDisk Technologies LLC.
U.S. Appl. No. 16/243,469, filed Jan. 9, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/251,782, filed Jan. 18, 2019, SanDisk Technologies LLC.
U.S. Appl. No. 16/251,954, filed Jan. 18, 2019, SanDisk Technologies LLC.
U.S. Appl. No. 16/255,413, filed Jan. 23, 2019, SanDisk Technologies LLC.
U.S. Appl. No. 16/261,869, filed Jan. 30, 2019, SanDisk Technologies LLC.
U.S. Appl. No. 16/263,058, filed Jan. 31, 2019, SanDisk Technologies LLC.
U.S. Appl. No. 16/263,086, filed Jan. 31, 2019, SanDisk Technologies LLC.
U.S. Appl. No. 16/274,687, filed Feb. 13, 2019, SanDisk Technologies LLC.
U.S. Appl. No. 16/284,502, filed Feb. 25, 2019, SanDisk Technologies LLC.
USPTO Office Communication, Notice of Allowance and Fees Due for U.S. Appl. No. 16/917,597, dated Sep. 29, 2021, 19 pages.
USPTO Office Communication, Notice of Allowance and Fees Due for U.S. Appl. No. 17/106,831, dated Mar. 23, 2022, 25 pages.

* cited by examiner

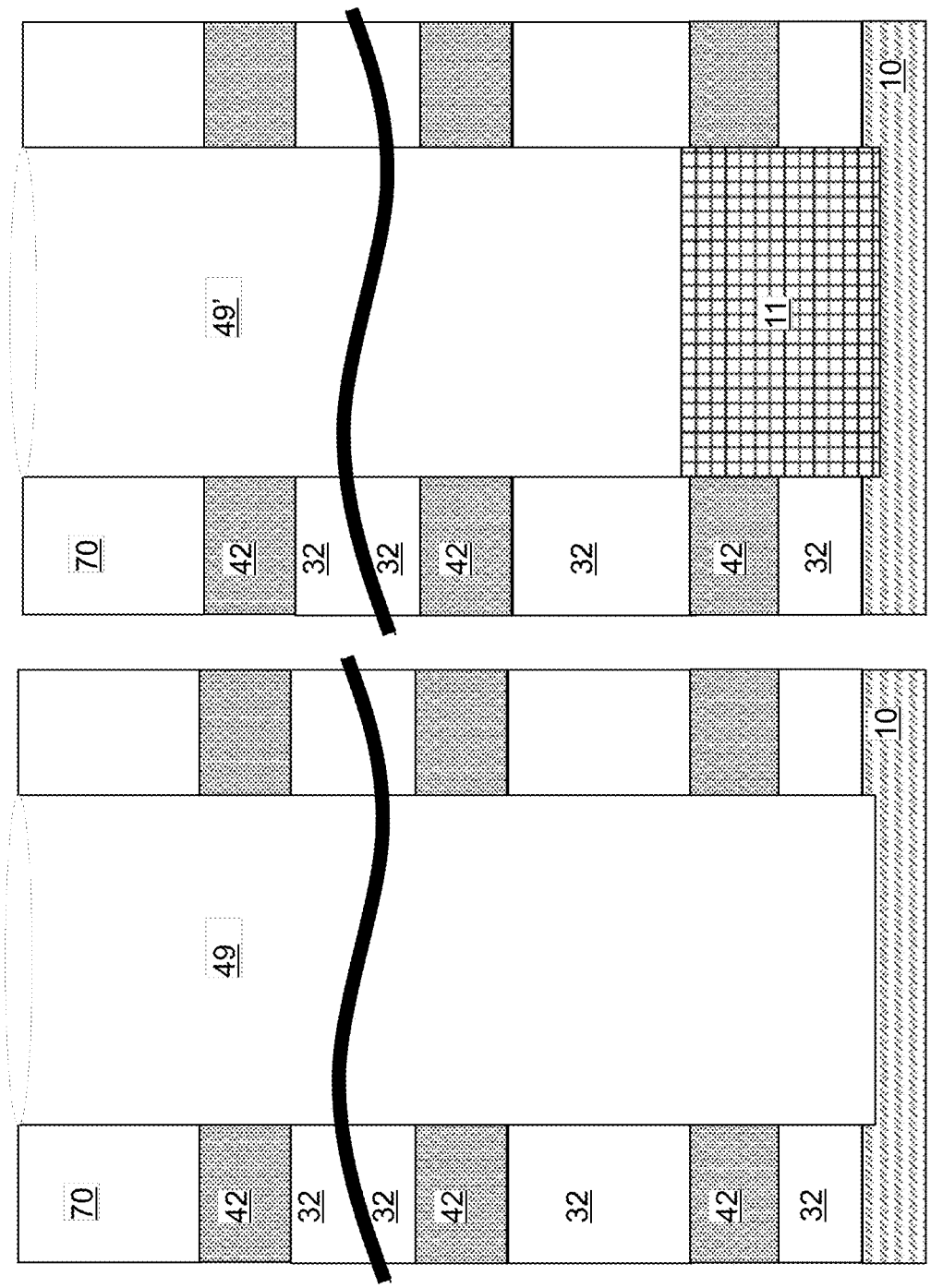

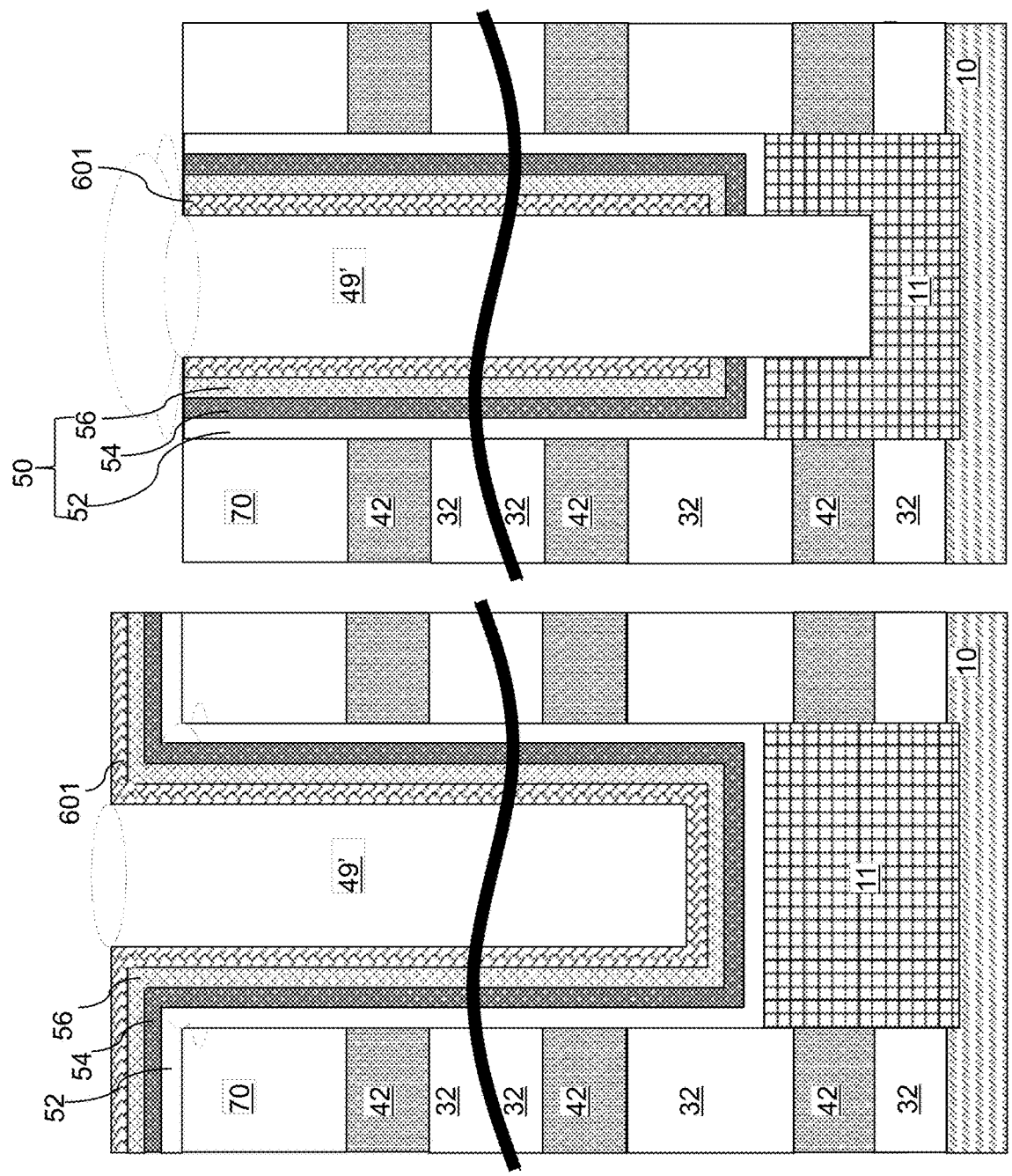

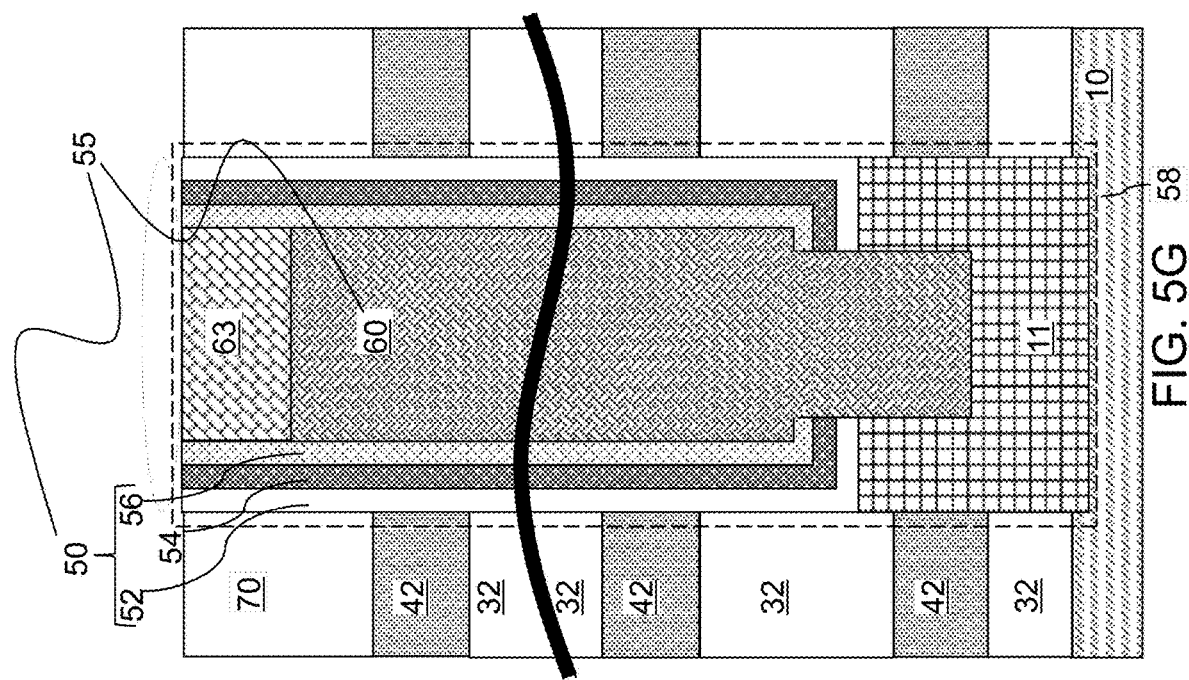

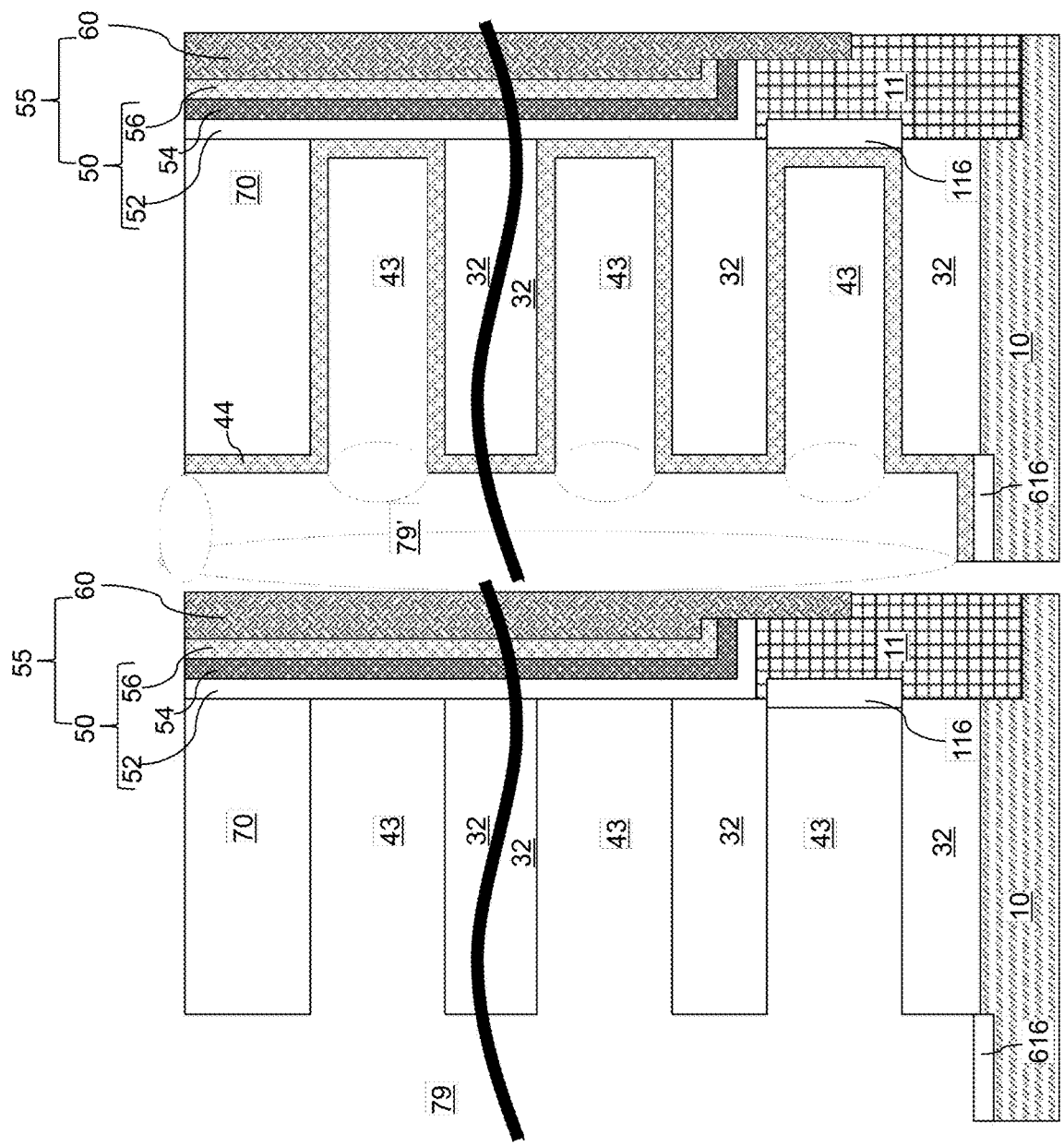

THREE-DIMENSIONAL MEMORY DEVICE HAVING AN EPITAXIAL VERTICAL SEMICONDUCTOR CHANNEL AND METHOD FOR MAKING THE SAME

FIELD

The present disclosure relates generally to the field of semiconductor devices, and particular to a three-dimensional memory device using epitaxial vertical semiconductor channels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure includes a memory die bonded to a support die. The memory die includes an alternating stack of insulating layers and electrically conductive layers located over a substrate including a single crystalline substrate semiconductor material, and memory stack structures extending through the alternating stack and containing a respective memory film and a respective vertical semiconductor channel including a single crystalline channel semiconductor material. The support die contains a peripheral circuitry.

According to another embodiment of the present disclosure a method of forming a semiconductor structure includes forming an alternating stack of insulating layers and spacer material layers over a substrate of a memory die, wherein the substrate includes a single crystalline substrate semiconductor material, and wherein the sacrificial material layers are formed as, or are subsequently replaced with, electrically conductive layers, forming memory openings through the alternating stack, forming memory films in the memory openings, filling volumes of the memory openings that are not filled with the memory films with single crystalline semiconductor channel material portions having a doping of a first conductivity type and in epitaxial alignment with the single crystalline substrate semiconductor material, and bonding a support die containing peripheral circuitry to the memory die.

BRIEF DESCRIPTION OF THE DRAWINGS

FIGS. 5A-5G are sequential schematic vertical cross-sectional views of a memory opening within the exemplary structure during formation of a memory stack structure, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
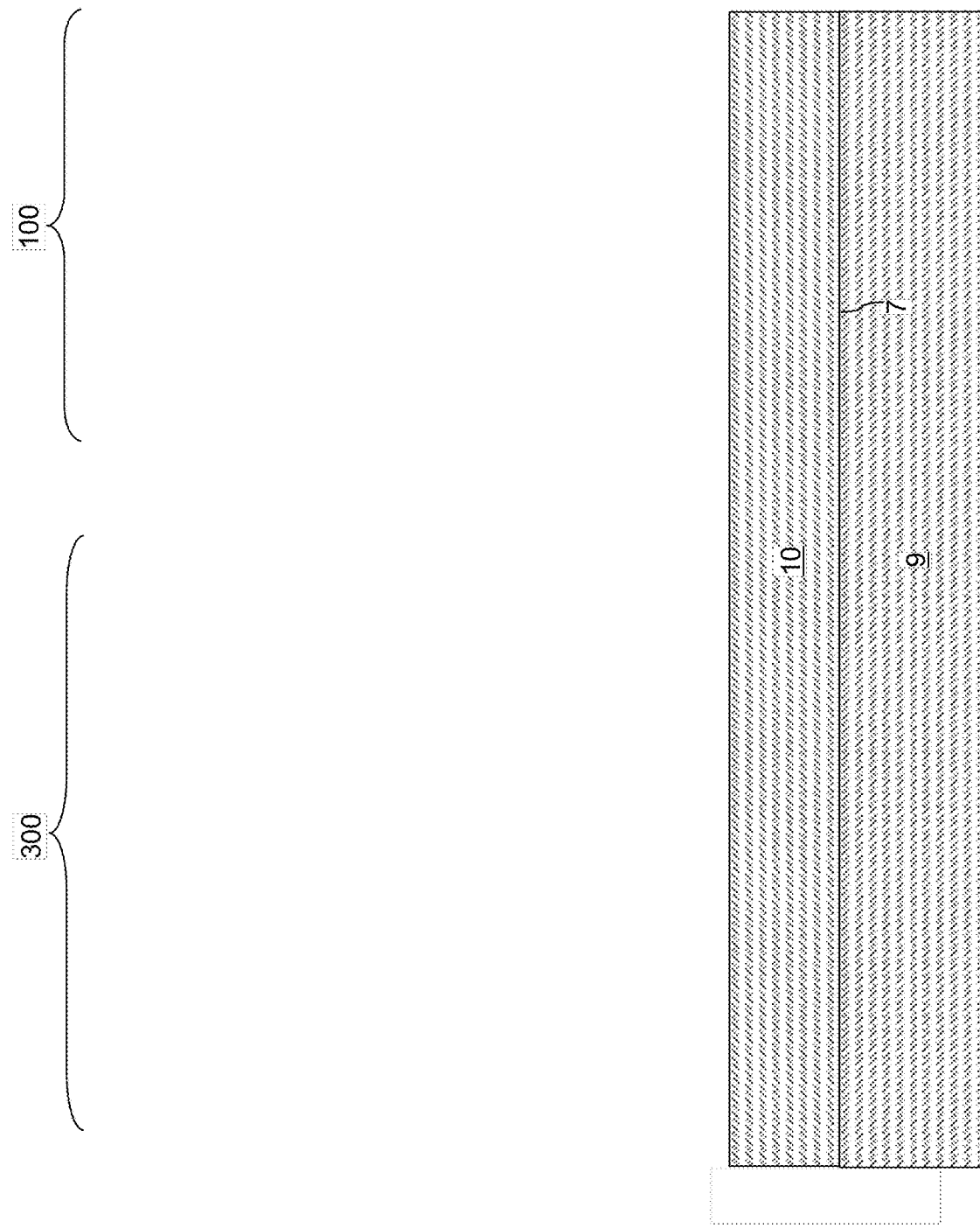
FIG. 1 is a schematic vertical cross-sectional view of an exemplary structure after formation of a semiconductor material layer on a substrate semiconductor layer according to an embodiment of the present disclosure.

As the total number of word lines increases in the three-dimensional memory devices, vertical semiconductor channels of the vertical NAND strings become longer, thereby decreasing the on-current for the vertical semiconductor channels. In order to vertically scale the three-dimensional memory device and to provide stacking a greater number of word lines, the on-current of the vertical semiconductor channels may be increased in various disclosed embodiments by using epitaxial vertical semiconductor channels. Various embodiments disclosed herein are directed to a three-dimensional memory device using epitaxial vertical semiconductor channels and methods of manufacturing the same, the various aspects of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which includes a single crystalline substrate semiconductor material, i.e., a single crystalline semiconductor material located in a substrate. The substrate (9, 10) may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate (9, 10) may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface. The entirety of the substrate (9, 10) may consist essentially of the single crystalline substrate semiconductor material, which may be single crystalline silicon. In one embodiment, the single crystalline substrate semiconductor material of the semiconductor material layer 10 may have a doping of a first conductivity type, which may be p-type or n-type. In one embodiment, various doped wells may be provided in the upper portion of the substrate semiconductor layer 9 to electrically isolate the semiconductor material layer 10 from the substrate semiconductor layer 9. For example, a plurality of p-n junctions may be used to provide a nested doped well structure.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The optional semiconductor material layer 10, if present, may be formed on the top surface of the substrate semiconductor layer 9 by deposition of a single crystalline semiconductor material, for example, by an epitaxial deposition process. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. The region in which a memory array is subsequently formed is herein referred to as a memory array region 100. A staircase region 300 for subsequently forming stepped terraces of electrically conductive layers may be provided adjacent to the memory array region 100.

Figure 2:
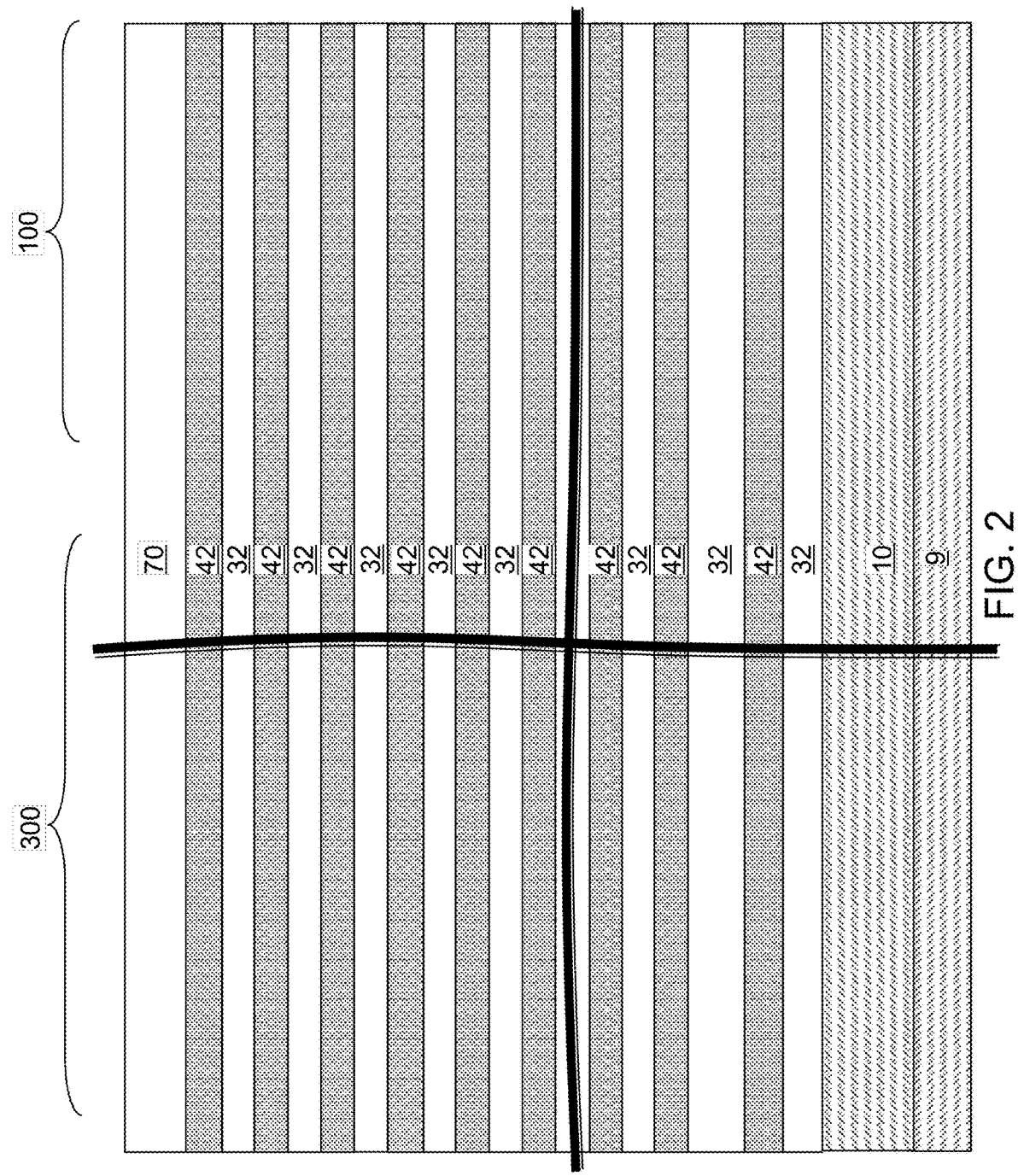
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In such embodiments, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
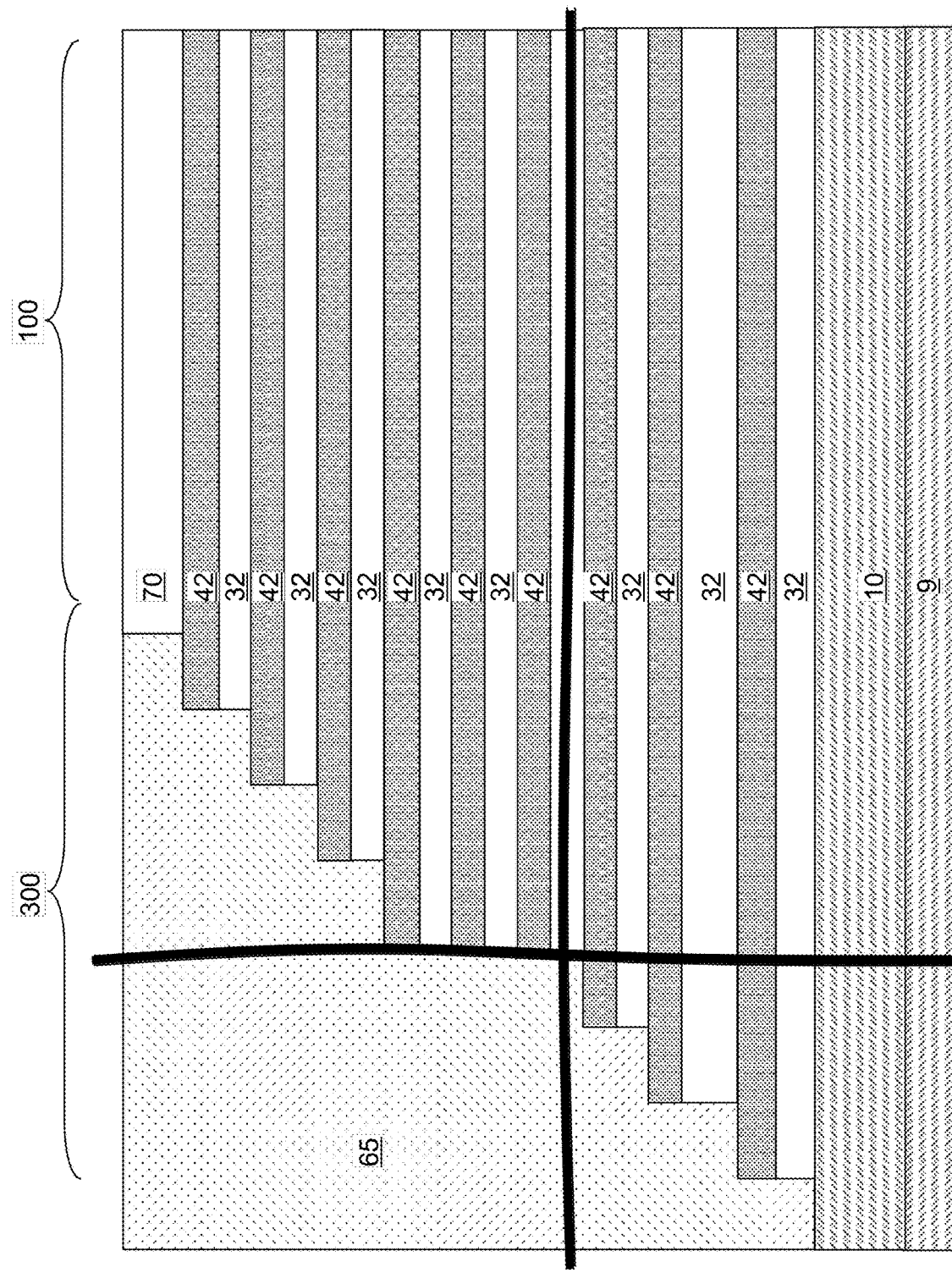
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed by patterning a portion of the alternating stack (32, 42) in the staircase region 300. The region of the stepped surfaces may also be referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is formed adjacent to the memory array region 100. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have a height of one or more pairs of an insulating layer 32 and a sacrificial material layer 42. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. In embodiments in which silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
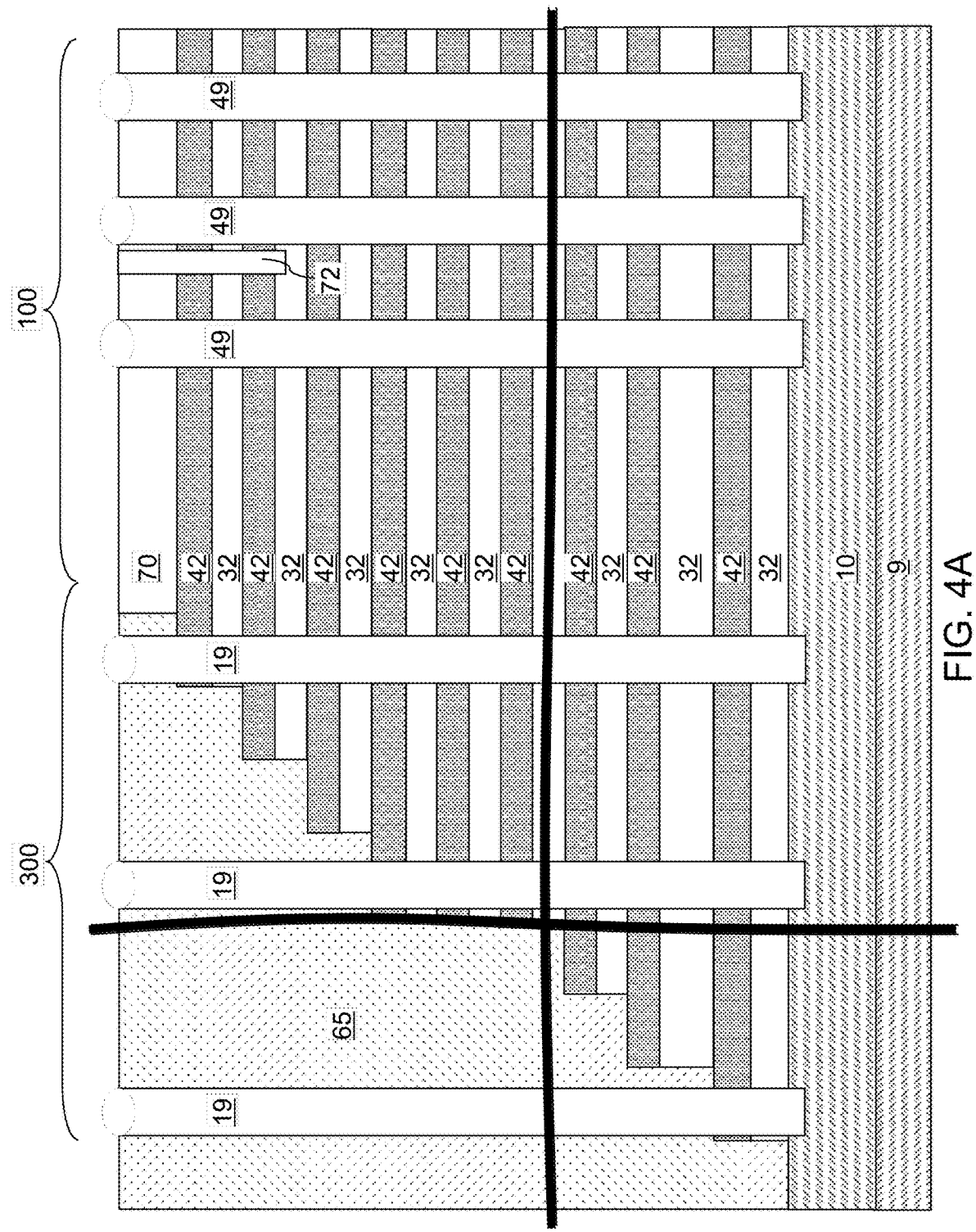
FIG. 4A is a schematic vertical cross-sectional view of the exemplary structure after formation of memory openings and support openings according to an embodiment of the present disclosure.
Figure 4B:
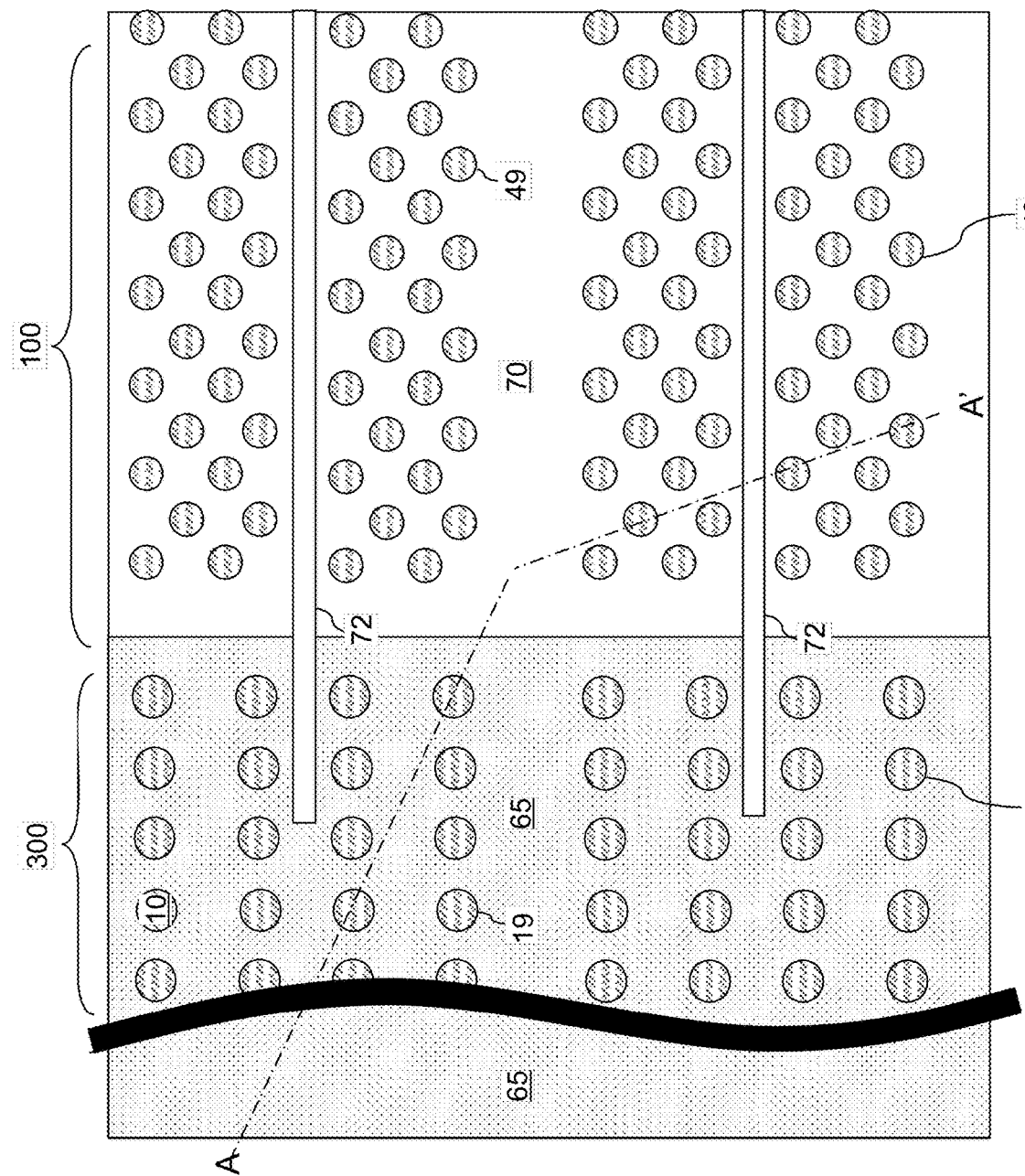
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 in the memory array region 100 and support openings 19 in the staircase region 300. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5G illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional epitaxial pedestal channel 11 may be formed at the bottom portion of each memory opening 49 and each support opening 19, for example, by performing a first selective epitaxy process. For example, the exemplary structure may be placed in a process chamber and heated to a deposition temperature, which may be in a range from 600 degrees Celsius to 1,000 degrees Celsius. A semiconductor precursor gas, an etchant gas, and a dopant gas including dopant atoms of the first conductivity type may be concurrently or alternately flowed into the process chamber to induce deposition of a single crystalline semiconductor material in epitaxial alignment with the single crystalline substrate semiconductor material of the semiconductor material layer 10 at the bottom of each memory opening 49 and at the bottom of each support opening 19. The deposited single crystalline semiconductor material is herein referred to as a single crystalline pillar semiconductor material.

The semiconductor precursor gas comprises a gas that generates semiconductor atoms upon dissociation. For example, the semiconductor precursor gas may include one or more of silane ($SiH_4$), dichlorosilane ($SiH_2Cl_2$), trichlorosilane ($SiHCl_3$), silicon tetrachloride ($SiCl_4$), disilane ($Si_2H_6$), chlorinated derivatives of disilane, germane ($GeH_4$), digermane ($Ge_2H_6$), chlorinated derivatives of germane or digermane, and other precursor gases for a compound semiconductor material. The etchant gas may include a gas that may etch the semiconductor material formed by decomposition of the semiconductor precursor gas. For example, the etchant gas may include gas phase hydrogen chloride (HCl). Alternatively, the etchant gas may be omitted if the semiconductor precursor gas includes a chlorinated compound of a semiconductor element and if hydrogen chloride may be generated by decomposition of the semiconductor precursor gas. The dopant gas may be, for example, a hydride gas of dopants of the first conductivity type. If the first conductivity type is p-type, the dopant gas may be diborane ($B_2H_6$). If the first conductivity type is n-type, the dopant gas may include phosphine ($PH_3$), arsine ($AsH_3$), or stibine ($SbH_3$).

A carrier gas such as hydrogen, argon, or nitrogen may be used to provide uniform gas flow in the process chamber. The flow rate of the carrier gas may be adjusted such that the total pressure of the first selective epitaxy process is in a range from 5 Torr to 200 Torr. If the process temperature is greater than 700 degrees Celsius, hydrogen or argon may be used as the carrier gas to prevent nitridation of semiconductor surfaces. A wet etch using hydrofluoric acid may be performed prior to the first selective epitaxy process to remove surface oxide material from the physically exposed surfaces of the semiconductor material layer 10. A hydrogen anneal at an elevated temperature may be performed to remove any native oxide and to provide atomically ordered semiconductor surfaces before the first selective epitaxy process.

The first selective epitaxy process grows the epitaxial pedestal channels 11 at bottom regions of the memory openings 49 and the support openings 19, while suppressing growth of any semiconductor material from dielectric surfaces such as surfaces of the memory films 50, the alternating stack (32, 42), and the retro-stepped dielectric material portion 65. The epitaxial pedestal channels 11 includes a single crystalline pillar semiconductor material that is in epitaxial alignment with the single crystalline substrate semiconductor material of the semiconductor material layer 10 and the substrate semiconductor layer 9.

In one embodiment, the top surface of each epitaxial pedestal channel 11 may be formed above a horizontal plane including the top surface of a bottommost sacrificial material layer 42. In this case, a source select gate electrode may be subsequently formed by replacing the bottommost sacrificial material layer 42 with a conductive material layer. The epitaxial pedestal channel 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the epitaxial pedestal channel 11.

In one embodiment, the epitaxial pedestal channels 11 may have a doping of the first conductivity type, which is the same as the conductivity type of the semiconductor material layer 10. If a semiconductor material layer 10 is not present, the epitaxial pedestal channel 11 may be formed directly on the substrate semiconductor layer 9, which may have a doping of the first conductivity type. The atomic concentration of dopants of the first conductivity type in the epitaxial pedestal channels 11 may be in a range from $1.0 \times 10^{14}/cm^3$ to $1.0 \times 10^{18}/cm^3$, although lesser and greater dopant concentrations may also be used.

Referring to FIG. 5C, a stack of layers including a blocking dielectric layer 52, a charge storage layer 54, a tunneling dielectric layer 56, and an optional sacrificial cover material layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional sacrificial cover material layer 601 includes a material that functions as an etch mask during subsequent anisotropic etch steps that etch through the tunneling dielectric layer 56, the charge storage layer 54, and the blocking dielectric layer 52. Further, the material of the sacrificial cover material layer 601 may be selected such that the first cover material layer 601 may be subsequently removed selective to the material of the tunneling dielectric layer 56 in an isotropic etch process. For example, the sacrificial cover material layer 601 may include amorphous silicon, polysilicon, a silicon-germanium alloy, amorphous carbon, or a polymer material. The sacrificial cover material layer 601 may be formed by a conformal deposition method such as low pressure chemical vapor deposition (LPCVD). The thickness of the sacrificial cover material layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 5D, the optional sacrificial cover material layer 601, the tunneling dielectric layer 56, the charge storage layer 54, and the blocking dielectric layer 52 may be sequentially anisotropically etched using at least one anisotropic etch process. The portions of the sacrificial cover material layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the sacrificial cover material layer 601, the tunneling dielectric layer 56, the charge storage layer 54, and the blocking dielectric layer 52 at a bottom of each memory cavity 49' may be removed to form openings in remaining portions thereof. Each of the sacrificial cover material layer 601, the tunneling dielectric layer 56, the charge storage layer 54, and the blocking dielectric layer 52 may be etched by a respective anisotropic etch step using a respective etch chemistry, which may, or may not, be the same for the various material layers.

Each remaining portion of the sacrificial cover material layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the epitaxial pedestal channel 11 may be physically exposed underneath the opening through the sacrificial cover material layer 601, the tunneling dielectric layer 56, the charge storage layer 54, and the blocking dielectric layer 52 at the bottom of each memory cavity 49' and at the bottom of each support cavity (which is an unfilled portion of a support opening 19). A portion of the top surface of each epitaxial pedestal channel 11 may be vertically recessed from the bottom surface of the blocking dielectric layer 52 at the bottom of each memory opening 49 by a recess distance.

A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. Generally, a memory film 50 may be provided by forming a charge storage layer 54 comprising a charge trapping material within a memory opening 49, and by forming a tunneling dielectric layer directly on the charge storage layer 54.

In one embodiment, the sacrificial cover material layer 601, the tunneling dielectric layer 56, the charge storage layer 54, and the blocking dielectric layer 52 may have vertically coincident sidewalls, i.e., sidewalls that are located within a same vertical plane. Each memory film 50 is formed on a top surface of a respective one of the epitaxial pedestal channels 11.

Figures 5E, 5F:
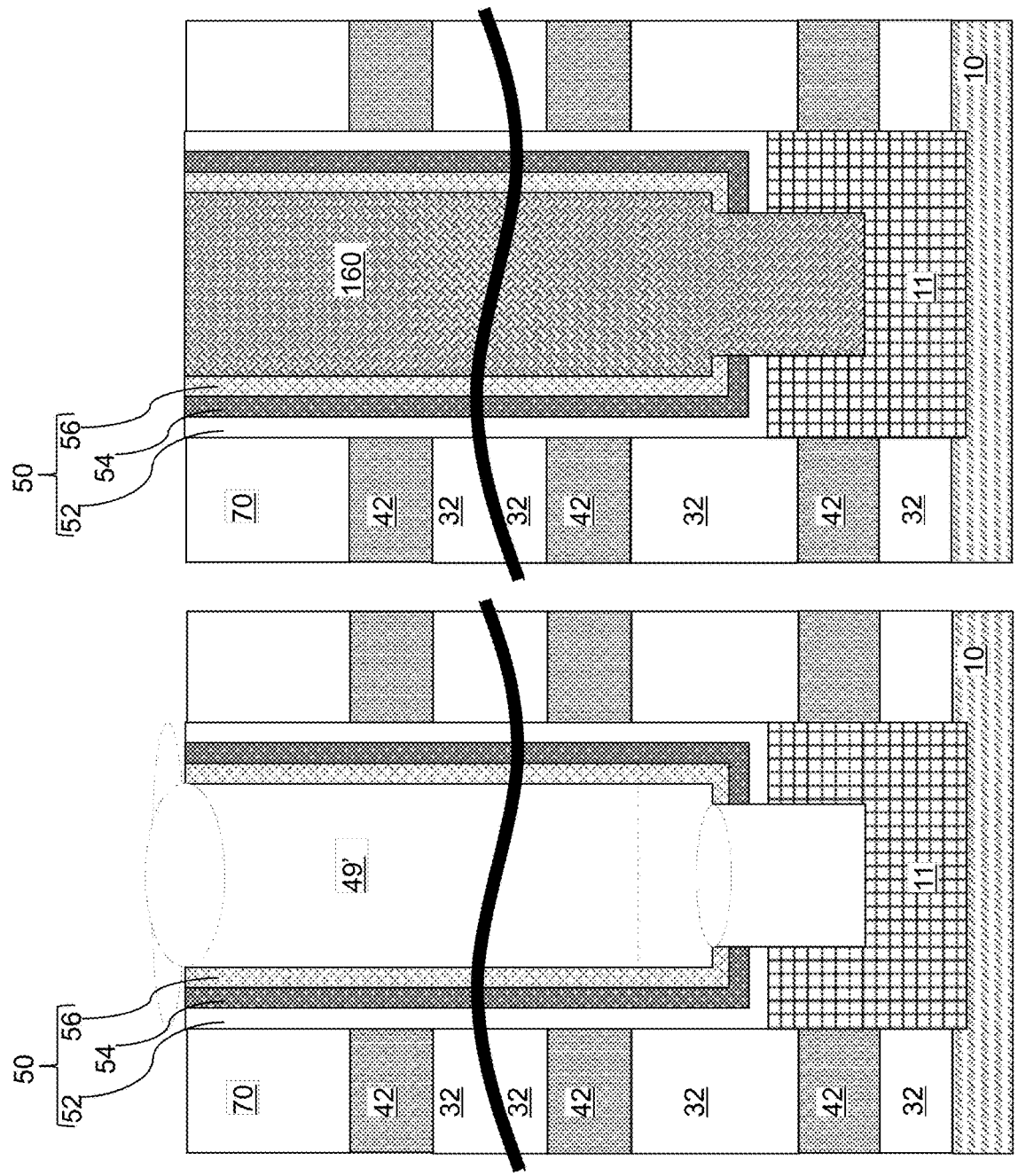

Referring to FIG. 5E, the sacrificial cover material layer 601 may be removed selective to the material of the tunneling dielectric layer 56. For example, if the sacrificial cover material layer 601 includes amorphous carbon, the sacrificial cover material layer 601 may be removed by ashing. If the sacrificial cover material layer 601 includes undoped amorphous silicon, a wet etch process using dilute trimethyl-2 hydroxyethyl ammonium hydroxide ("TMY"), dilute tetramethyl ammonium hydroxide (TMAH), or dilute KOH solution may be performed to remove the sacrificial cover material layer 601.

Referring to FIG. 5F, a second selective epitaxy process may be performed to epitaxially grow a single crystalline semiconductor material, such as single crystal silicon, from each physically exposed surface of the epitaxial pedestal channels 11. The single crystalline semiconductor material is formed within each memory cavity 49' such that the entire volume of each memory cavity 49' is filled by the single crystalline semiconductor material. Excess portions of the single crystalline semiconductor material formed above a horizontal plane including the top surface of the insulating cap layer 70 may be removed by a planarization process such as a recess etch process and/or a chemical mechanical planarization process. A single crystalline semiconductor channel material portion 160 may be formed in each memory opening 49. Each single crystalline semiconductor channel material portion 160 may extend through an opening in a memory film 50, and contact a bottom surface and a sidewall of an underlying epitaxial pedestal channel 11.

Each single crystalline semiconductor channel material portion 160 may fill volumes of a memory opening 49 that is not filled with an epitaxial pedestal channel 11 and a memory film 50. The single crystalline semiconductor channel material portions 160 may have a doping of a first conductivity type, and may be in epitaxial alignment with the single crystalline substrate semiconductor material of the substrate (9, 10). The single crystalline semiconductor channel material portions 160 may be formed directly on the tunneling dielectric layers 56.

The second selective epitaxy process may performed, for example, by disposing the exemplary structure in a process chamber. The process chamber may be heated to a deposition temperature, which may be in a range from 850 degrees Celsius to 1,100 degrees Celsius, such as 900 degrees Celsius to 1,050 degrees Celsius to provide a high deposition rate. A semiconductor precursor gas, an etchant gas, and a dopant gas including dopant atoms of the first conductivity type may be concurrently or alternately flowed into the process chamber to induce deposition of a single crystalline semiconductor material in epitaxial alignment with the single crystalline substrate semiconductor material of the semiconductor material layer 10 at the bottom of each memory opening 49 and at the bottom of each support opening 19.

The semiconductor precursor gas, the etchant gas, and the dopant gas may be flowed into the process chamber while the exemplary structure is at the deposition temperature. An externally supplied etchant gas is optional if an etchant gas is generated as a byproduct of decomposition of the semiconductor precursor gas. The semiconductor precursor gas comprises a gas that generates semiconductor atoms upon dissociation. In one embodiment, the semiconductor precursor gas may be selected to provide a deposition rate greater than 100 nm per minute. The second selective epitaxy process may use silane ($SiH_4$), dichlorosilane ($SiH_2Cl_2$), trichlorosilane ($SiHCl_3$), silicon tetrachloride ($SiCl_4$), disilane ($Si_2H_6$), chlorinated derivatives of disilane, germane ($GeH_4$), digermane ($Ge_2H_6$), chlorinated derivatives of germane or digermane, and other precursor gases for a compound semiconductor material. If a silicon containing precursor gas is used, then single crystalline semiconductor channel material portions 160 comprise single crystal silicon which may be grown at a growth rate in a range from 150 nm/min to 800 nm/min. If a germanium containing precursor gas is used, then single crystalline semiconductor channel material portions 160 comprise single crystal germanium. If a chlorine containing precursor gas is used in a hydrogen carrier gas, then this may induce collateral formation of hydrogen chloride gas that functions as an etchant. Alternatively, an etchant gas, such as hydrogen chloride may also be used. Thus, use of an additional etchant gas such as an independently supplied hydrogen chloride gas is optional during the second selective epitaxy process. The dopant gas may be, for example, a hydride gas of dopants of the first conductivity type. If the first conductivity type is p-type, the dopant gas may be diborane ($B_2H_6$). If the first conductivity type is n-type, the dopant gas may include phosphine ($PH_3$), arsine ($AsH_3$), or stibine ($SbH_3$).

A carrier gas such as hydrogen, argon, or nitrogen may be used to provide uniform gas flow in the process chamber. The flow rate of the carrier gas may be adjusted such that the total pressure of the first selective epitaxy process is in a range from 5 Torr to 200 Torr. Hydrogen or argon may be used as the carrier gas during the second selective epitaxy process. A wet etch using hydrofluoric acid may be performed prior to the second selective epitaxy process to remove surface oxide material from the physically exposed surfaces of the epitaxial pedestal channels 11. A hydrogen anneal at an elevated temperature may be performed to remove any native oxide and to provide atomically ordered semiconductor surfaces before the first selective epitaxy process.

The second selective epitaxy process may grow the single crystalline semiconductor channel material portions 160 from physically exposed semiconductor surfaces only, i.e., from the physically exposed semiconductor surfaces of the epitaxial pedestal channels 11, while suppressing growth of any semiconductor material from dielectric surfaces such as surfaces of the memory films 50, the alternating stack (32, 42), and the retro-stepped dielectric material portion 65. The single crystalline semiconductor channel material portions 160 includes a single crystalline pillar semiconductor material that is in epitaxial alignment with the single crystalline substrate semiconductor material of the semiconductor material layer 10 and the substrate semiconductor layer 9 through the single crystalline semiconductor materials of the epitaxial pedestal channels 11.

The single crystalline semiconductor channel material portions 160 may have a doping of the first conductivity type, which is the same as the conductivity type of the semiconductor material layer 10 and the epitaxial pedestal channels 11. The atomic concentration of dopants of the first conductivity type in the single crystalline semiconductor channel material portions 160 may be in a range from $1.0 \times 10^{14}/cm^3$ to $1.0 \times 10^{18}/cm^3$, although lesser and greater dopant concentrations may also be used. The growth of the single crystalline semiconductor channel material portions 160 is vertical, and thus, the single crystalline semiconductor channel material portions 160 may be formed without voids therein. In one embodiment, the entire volume of a single crystalline semiconductor channel material portion 160 may be encapsulated by surfaces of the single crystalline semiconductor channel material portion 160, and may be filled only with the single crystalline semiconductor material of the single crystalline semiconductor channel material portion 160 without any cavity or any other material portion therein. In one embodiment, each single crystalline semiconductor channel material portion 160 may have a cylindrical shape and a bottom-side protrusion that protrudes downward through an opening in a memory film 50. In one embodiment, the single crystalline semiconductor channel material portions 160 may have a circular horizontal cross-sectional shape. In one embodiment, surfaces of each single crystalline semiconductor channel material portion 160 may include a first cylindrical surface that contacts an inner cylindrical surface of a memory film 50, an annular bottom surface that contacts an annular horizontal surface of the memory film 50, a second cylindrical surface that contacts an opening through the memory film 50 and an inner cylindrical sidewall of an underlying epitaxial pedestal channel 11, and a bottom surface that contacts a recessed surface of the underlying epitaxial pedestal channel 11.

Referring to FIG. 5G, upper regions of the single crystalline semiconductor channel material portions 160 may be converted into drain regions 63 by implantation of dopants of a second conductivity type, which is the opposite of the first conductivity type. For example, if the first conductivity type is p-type, the second conductivity type is n-type, and vice versa. Implantation of the dopants of the second conductivity type may be performed by ion implantation or by plasma doping. The drain regions 63 may have a net doping of the second conductivity type with a net dopant concentration (i.e., the dopant concentration for the second conductivity type dopants less the dopant concentration for the first conductivity type dopants) in a range from $5.0 \times 10^{19}/cm^3$ to $2.0 \times 10^{21}/cm^3$, although lesser and greater dopant concentrations may also be used. Remaining regions of the single crystalline semiconductor channel material portions 160 constitute vertical semiconductor channels 60. Each combination of a memory film 50 and a vertical semiconductor channel 60 constitutes a memory stack structure 55.

Each memory stack structure 55 is a combination of a vertical semiconductor channel 60, a tunneling dielectric layer 56, a charge storage layer 54 that includes a vertical stack of memory elements (comprising portions of the charge storage layer 54 located at the levels of the sacrificial material layers 42), and an optional blocking dielectric layer 52. Each combination of an epitaxial pedestal channel 11 (if present), a memory stack structure 55, and a drain region 63 within a memory opening 49 is herein referred to as a memory opening fill structure 58. Each combination of an epitaxial pedestal channel 11 (if present), a memory film 50, a vertical semiconductor channel 60, and a drain region 63 within each support opening 19 fills the respective support openings 19, and constitutes a support pillar structure.

Figure 6:
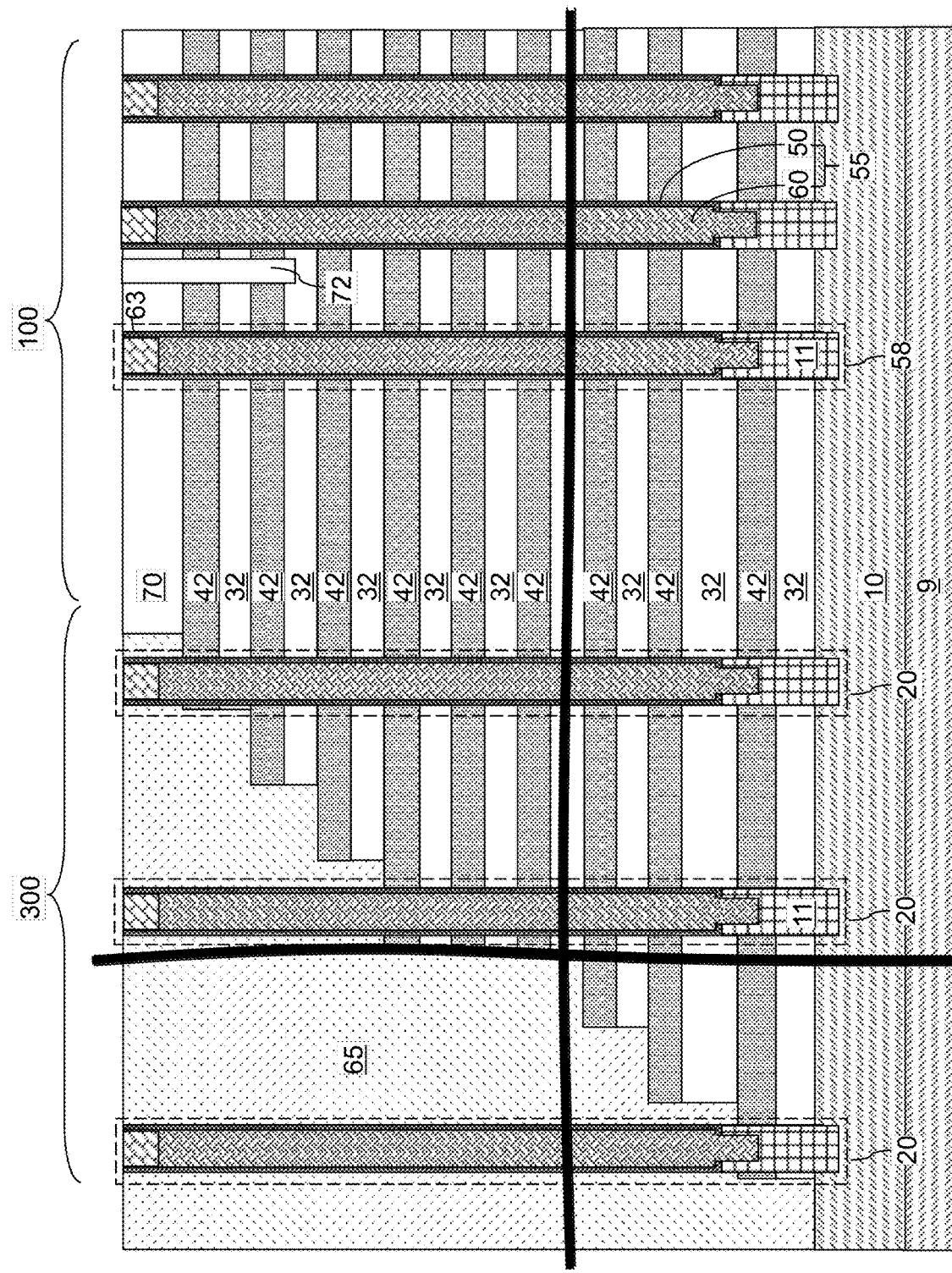
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B. While the present disclosure is described using an embodiment in which epitaxial pedestal channels 11 are used, embodiments are expressly contemplated herein in which the vertical semiconductor channels 60 are formed directly on the semiconductor material layer 10 or the substrate semiconductor layer 9 without the epitaxial pedestal channels 11.

Each memory stack structure 55 extends through the alternating stack (32, 42), and comprises a respective memory film 50 and a respective vertical semiconductor channel 60 including a single crystalline channel semiconductor material. A crystallographic orientation of the single crystalline channel semiconductor material of the vertical semiconductor channels 60 and a crystallographic orientation of the single crystalline substrate semiconductor material of the substrate (9, 10) that have a same Miller index are parallel to one other for each respective Miller index. Thus, for any selected Miller index of the crystallographic structure of the material of the vertical semiconductor channels 60, the spatial orientation for a crystallographic direction with the selected Miller index in the vertical semiconductor channels 60 has the same azimuthal angle θ and the same polar angle φ in a spherical coordinate system as the spatial orientation for the crystallographic direction with the selected Miller index in the semiconductor material layer 10 (if present) and in the substrate semiconductor layer 9.

Figure 7A:
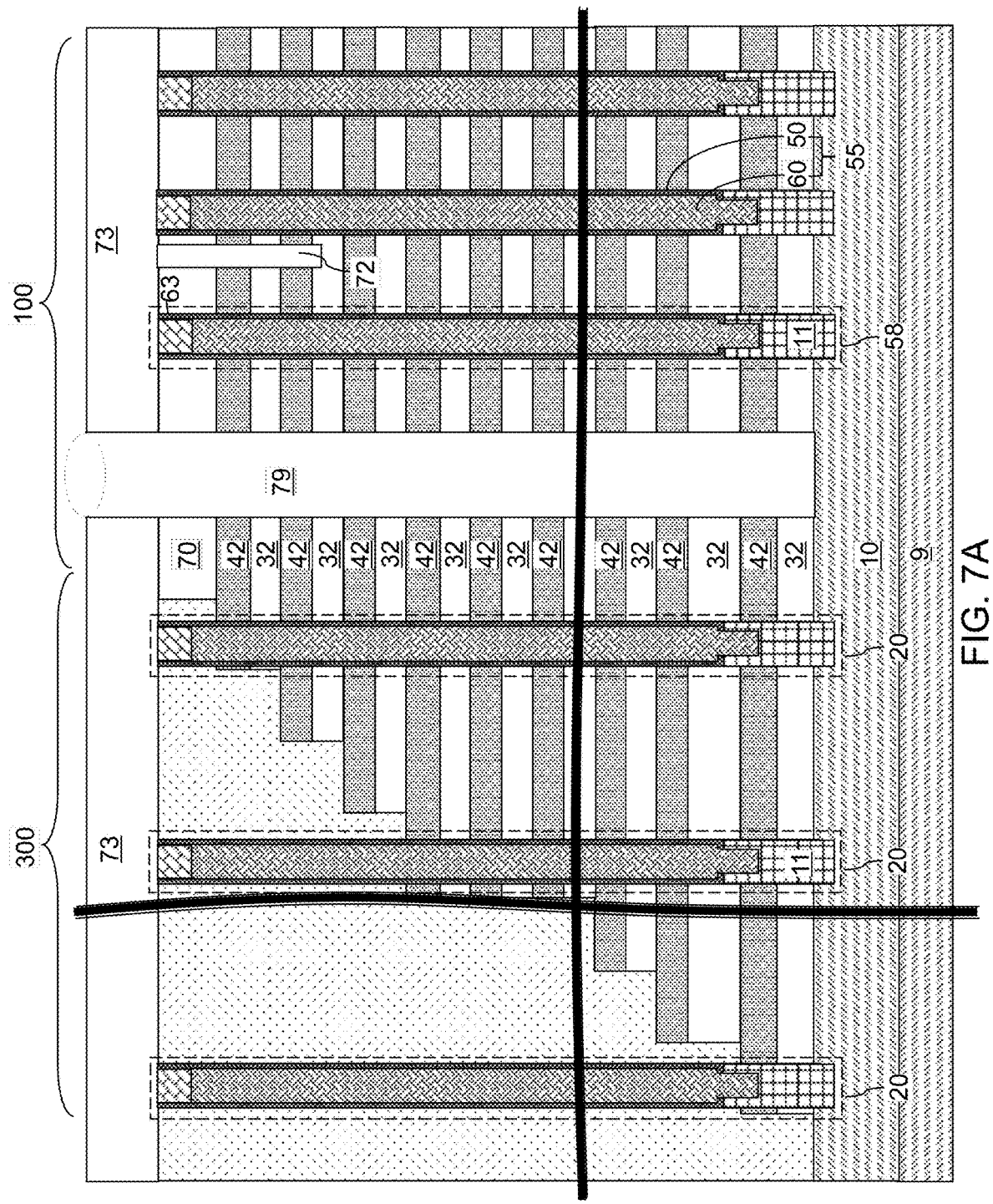
FIG. 7A is a schematic vertical cross-sectional view of the exemplary structure after formation of backside trenches according to an embodiment of the present disclosure.
Figure 7B:
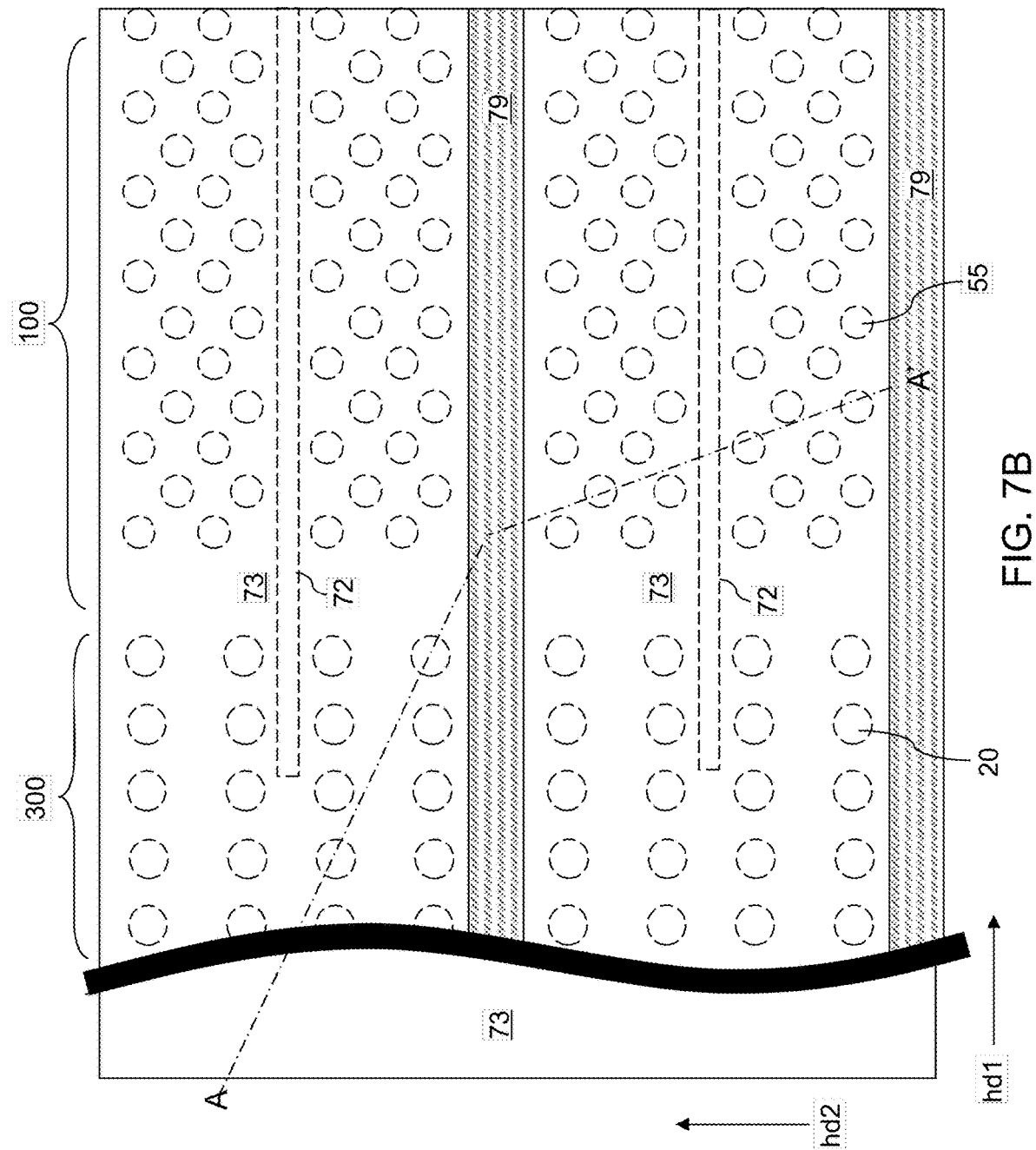
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
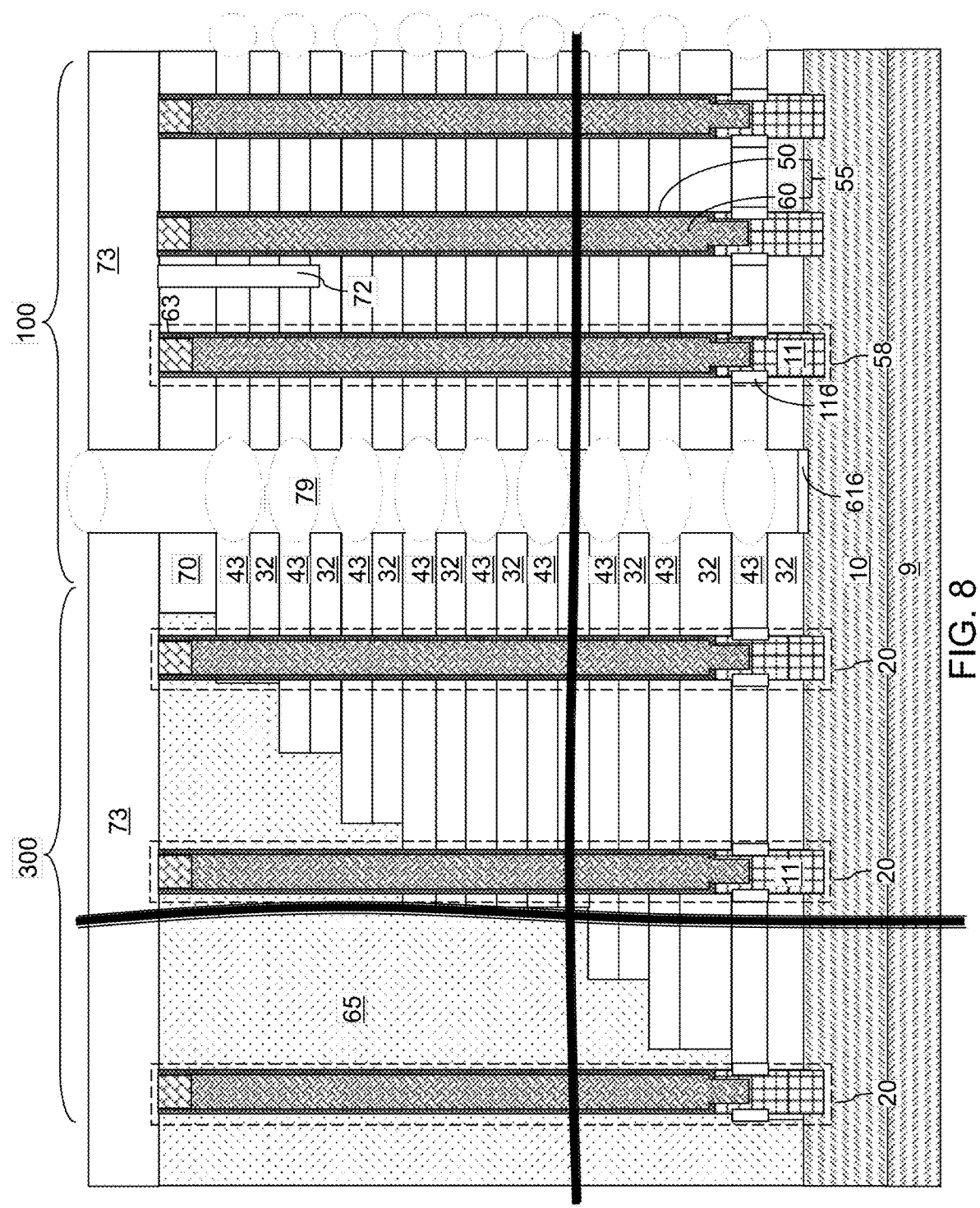
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, using an etch process. FIG. 9A illustrates a region of the exemplary structure of FIG. 8. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, in embodiments where the sacrificial material layers 42 include silicon nitride, the etch process may be a wet etch process in which the exemplary structure may be immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In such embodiments, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional epitaxial pedestal channels 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each epitaxial pedestal channel 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the epitaxial pedestal channels 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the epitaxial pedestal channels 11. Likewise, each planar dielectric portion 616 may include a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9D:
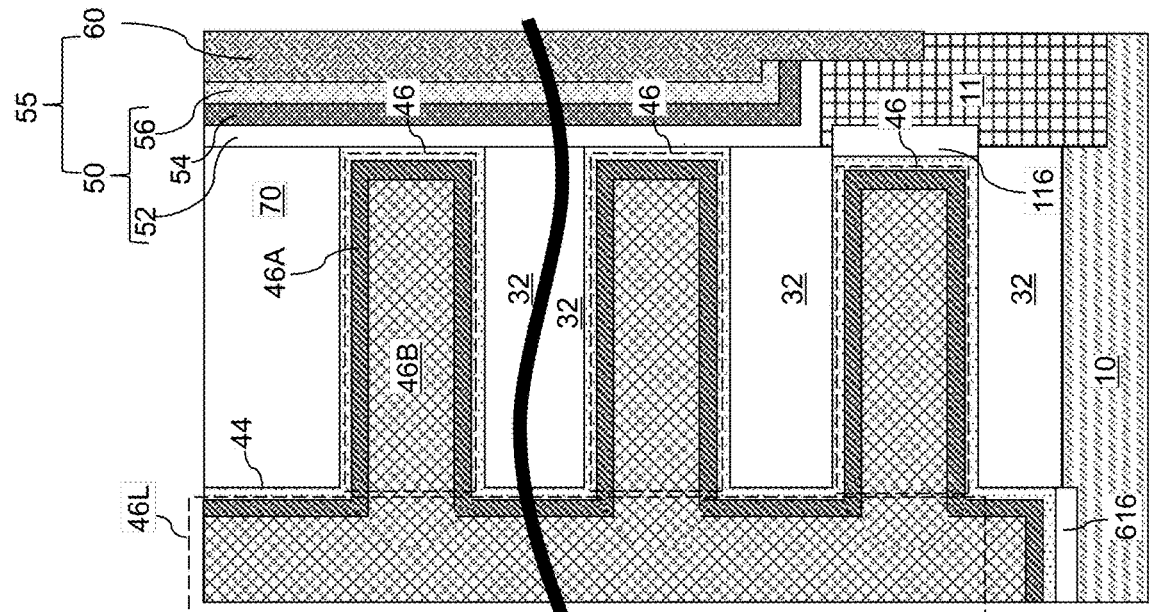
Figure 9C:
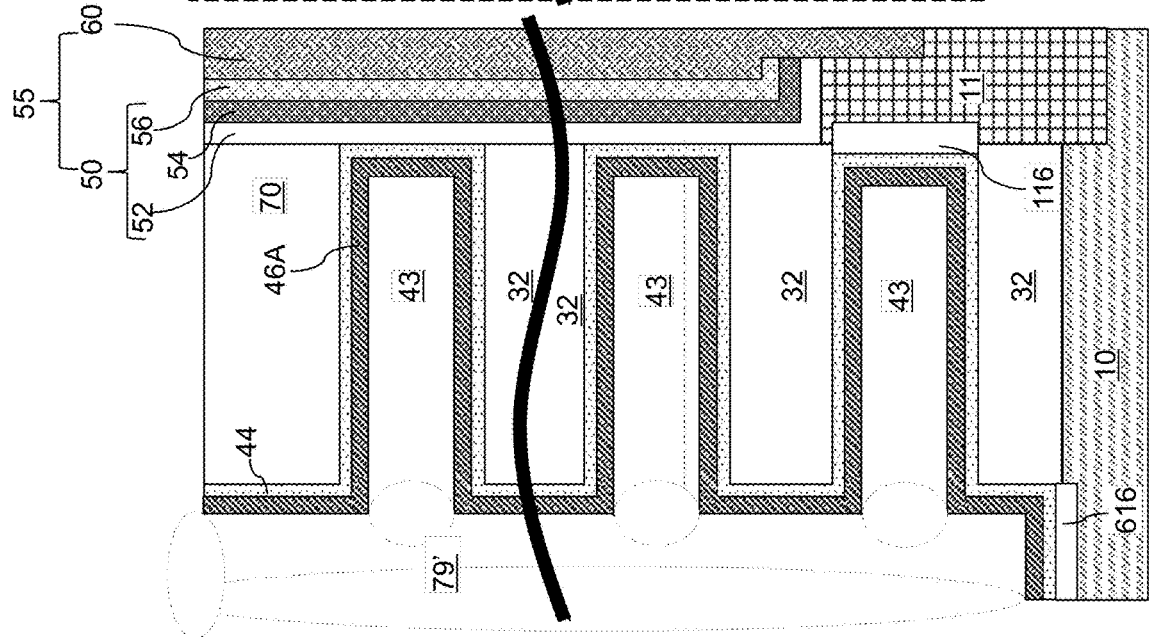

Referring to FIG. 9C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 10:
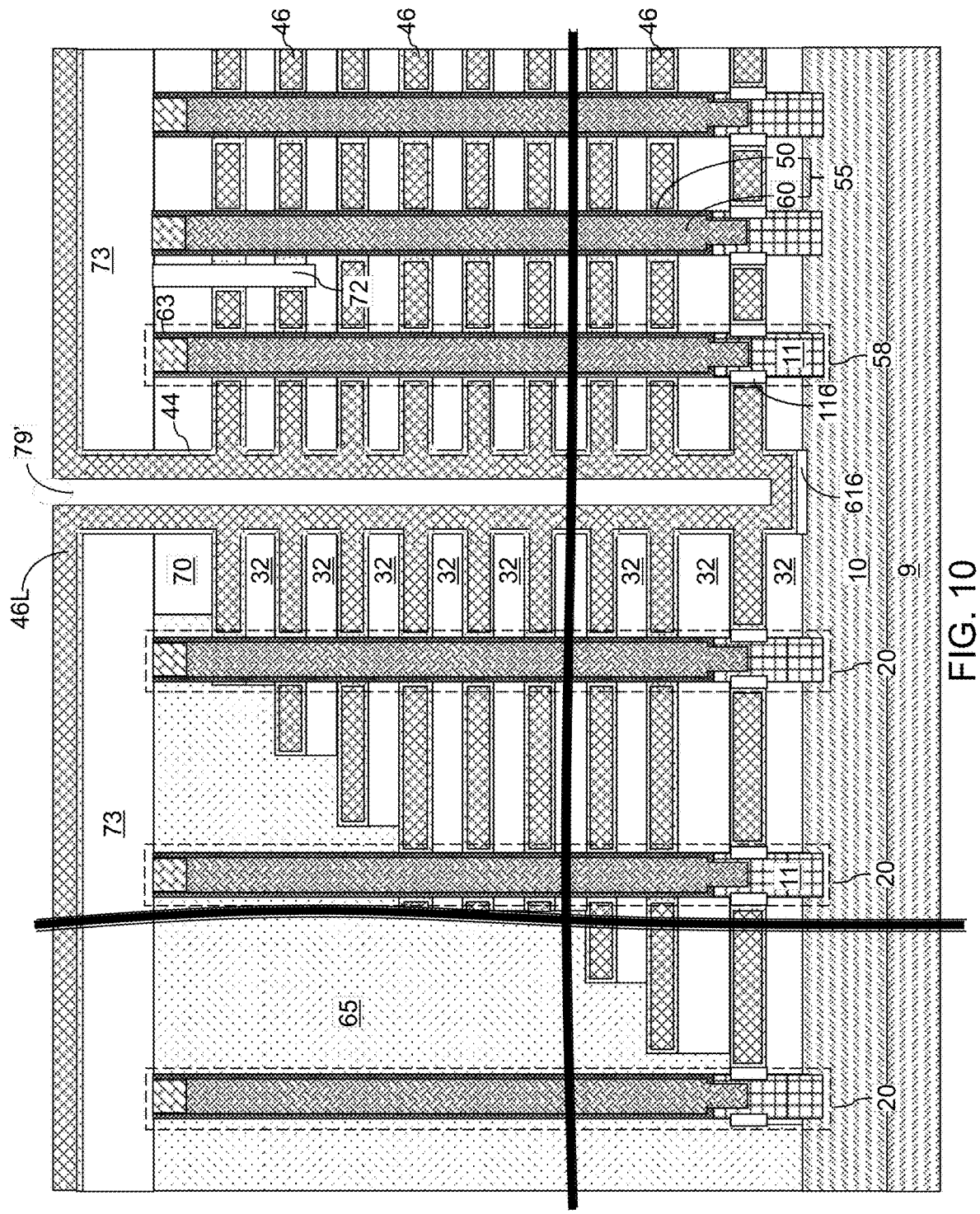
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' may be present in the portion of each backside trench 79 that is not filled with the backside blocking dielectric layer 44 and the continuous electrically conductive material layer 46L. A tubular dielectric spacer 116 laterally surrounds an epitaxial pedestal channel 11. A bottommost electrically conductive layer 46 laterally surrounds each tubular dielectric spacer 116 upon formation of the electrically conductive layers 46.

Figure 11A:
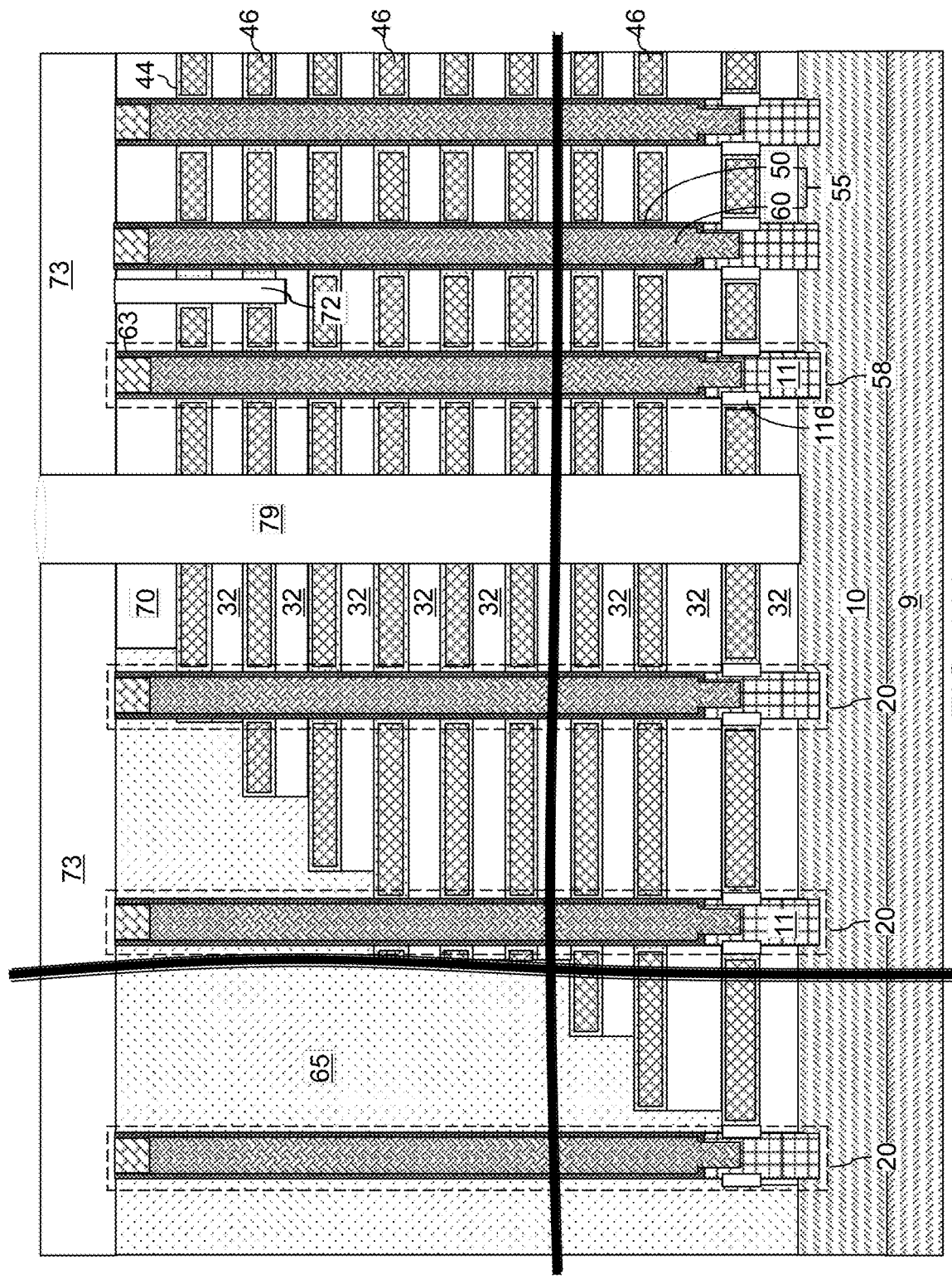
FIG. 11A is a schematic vertical cross-sectional view of the exemplary structure after removal of a deposited conductive material from within the backside trench according to an embodiment of the present disclosure.
Figure 11B:
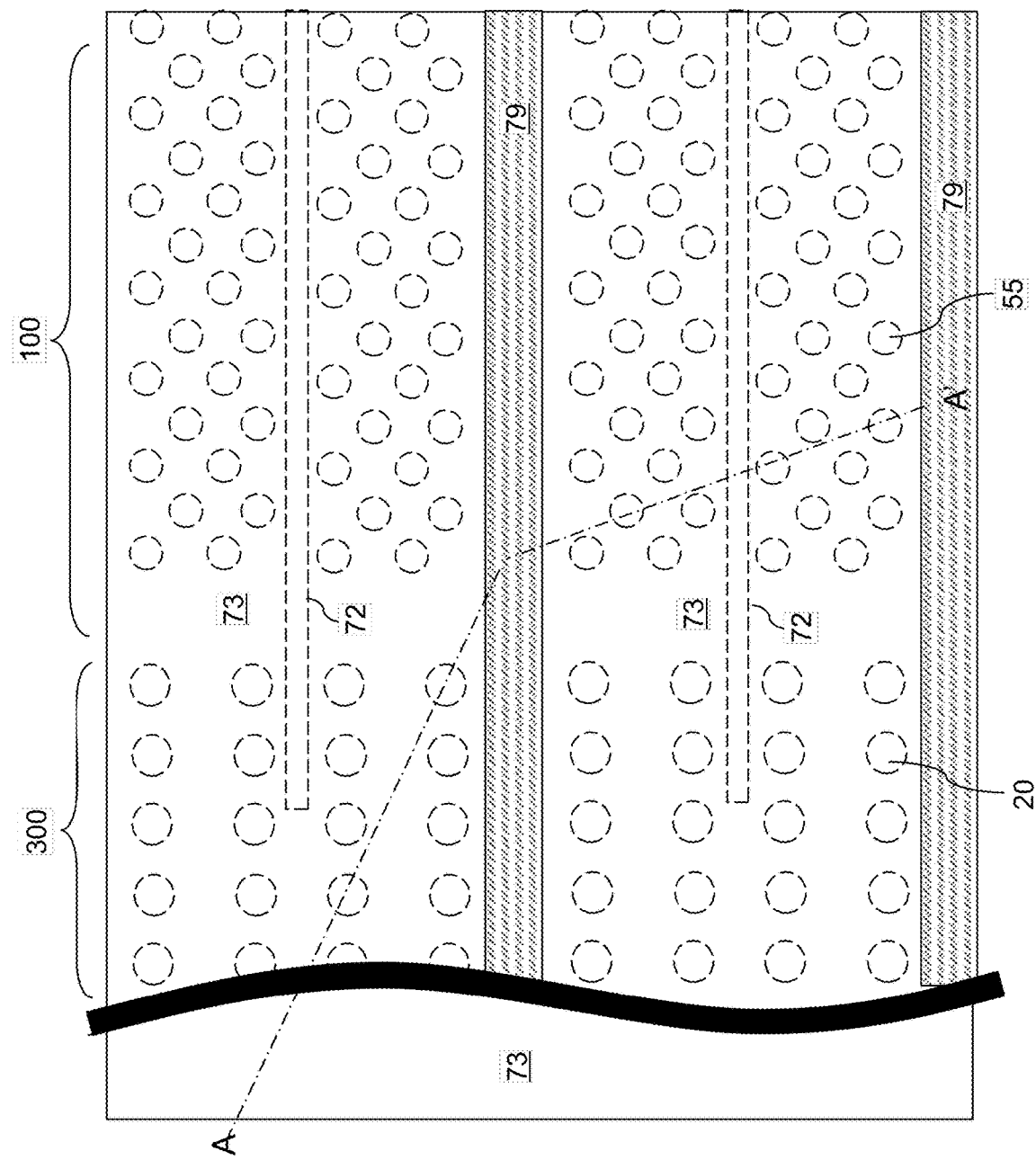
FIG. 11B is a partial see-through top-down view of the exemplary structure of FIG. 11A. The vertical plane A-A' is the plane of the schematic vertical cross-sectional view of FIG. 11A.

Referring to FIG. 11A, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Figure 12A:
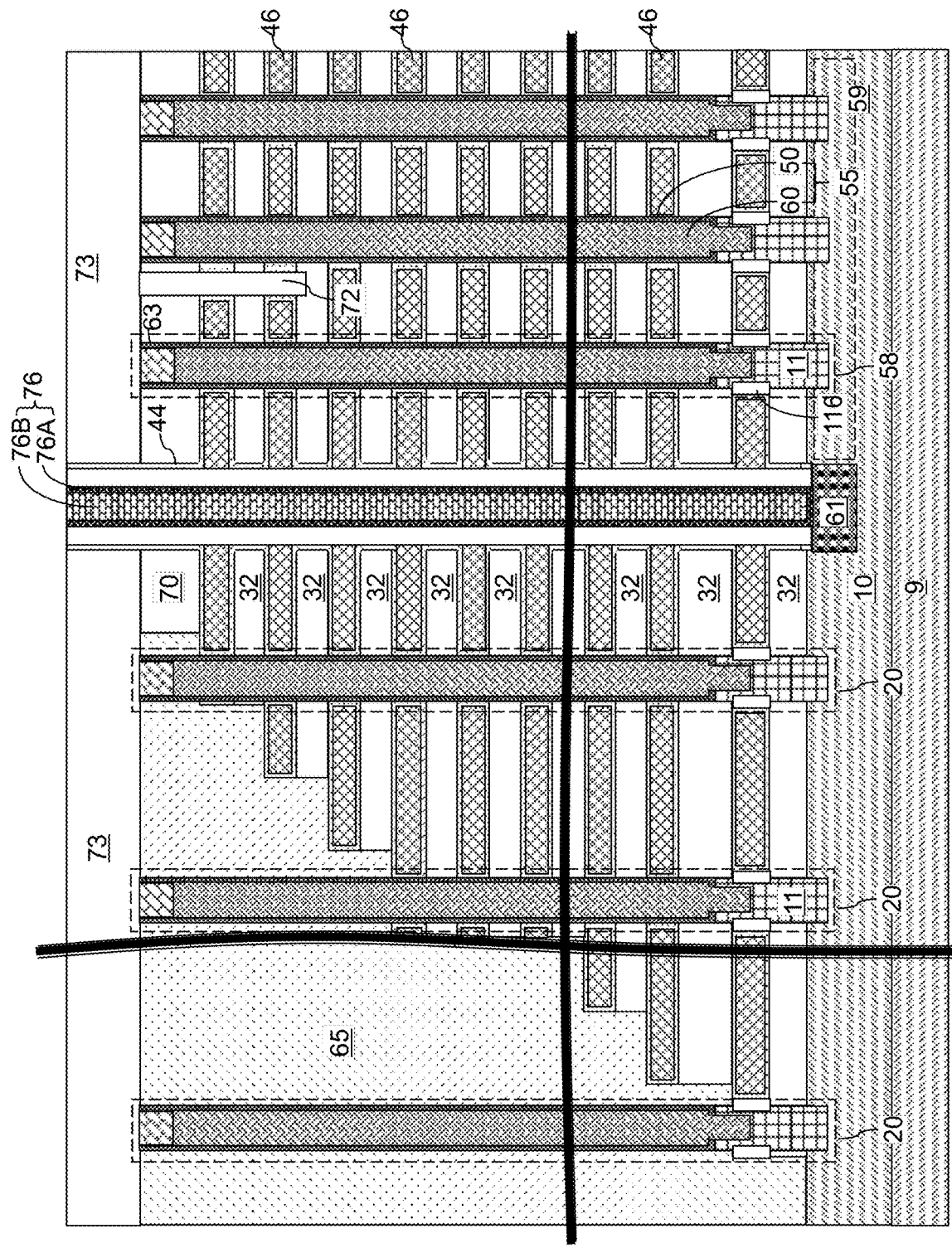
FIG. 12A is a schematic vertical cross-sectional view of the exemplary structure after formation of an insulating spacer and a backside contact structure according to an embodiment of the present disclosure.
Figure 12B:
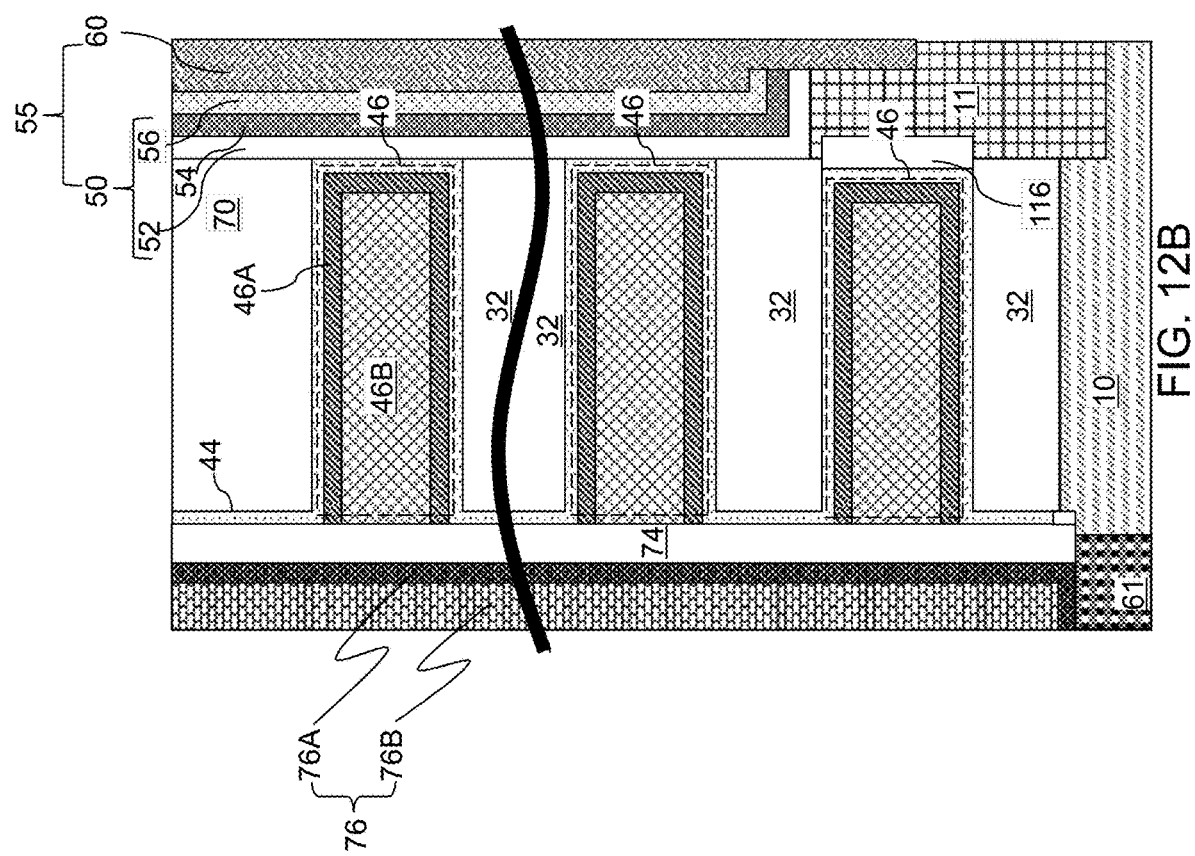
FIG. 12B is a magnified view of a region of the exemplary structure of FIG. 12A.

Referring to FIGS. 12A and 12B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74. Each source region 61 may be formed within the single crystalline substrate semiconductor material of the substrate (9, 10), and has a doping of the second conductivity type.

Each upper portion of the semiconductor material layer 10 that extends between the source region 61 and the plurality of epitaxial pedestal channels 11 constitutes a horizontal semiconductor channel 59 for a plurality of field effect transistors. Each horizontal semiconductor channel 59 is connected to multiple vertical semiconductor channels 60 through respective epitaxial pedestal channels 11. Each horizontal semiconductor channel 59 may contact a source region 61 and respective plurality of epitaxial pedestal channels 11. The horizontal semiconductor channels 59 includes the single crystalline substrate semiconductor material of the substrate (9, 10), and have a doping of the first conductivity type.

A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 13A:
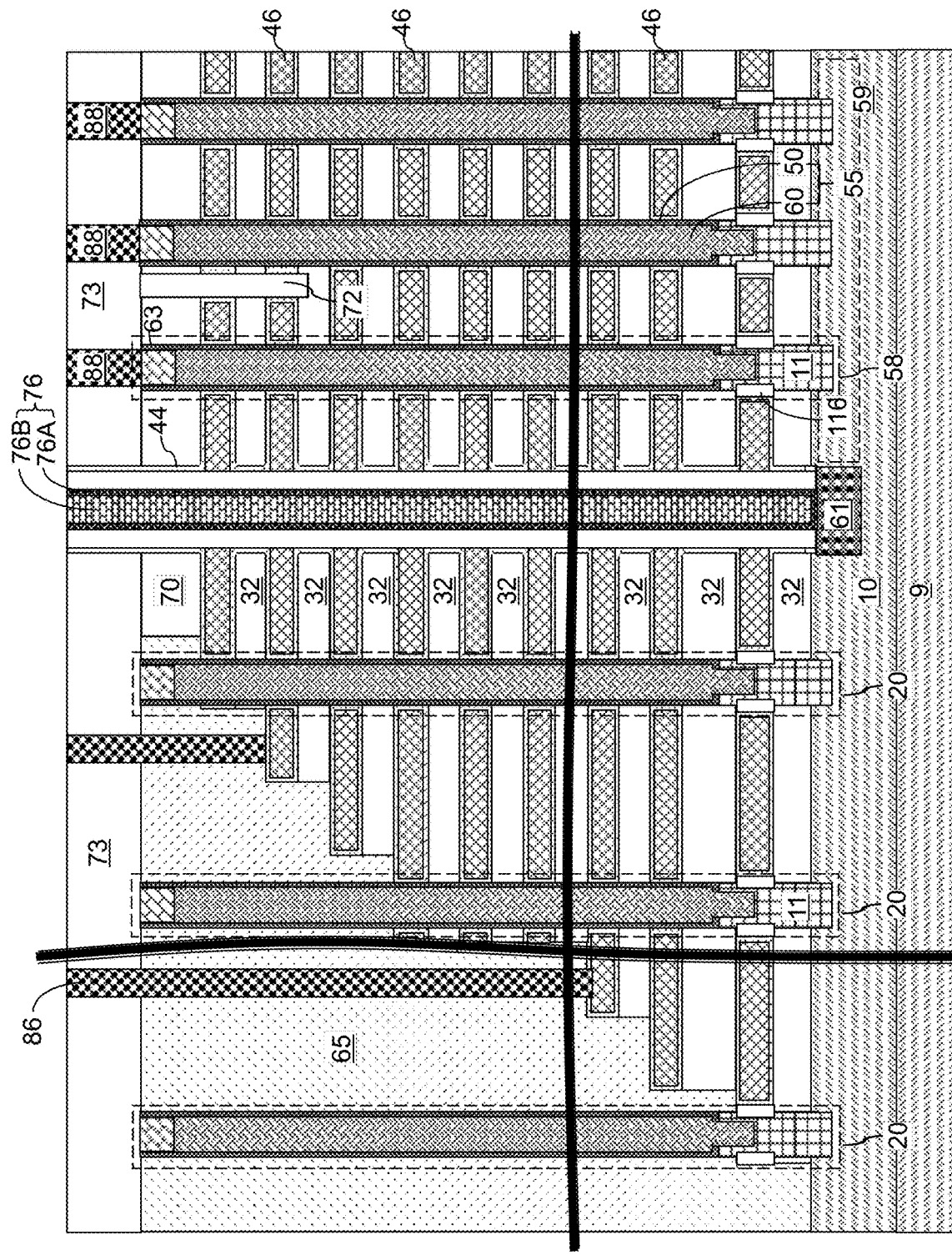
FIG. 13A is a schematic vertical cross-sectional view of the exemplary structure after formation of additional contact via structures according to an embodiment of the present disclosure.
Figure 13B:
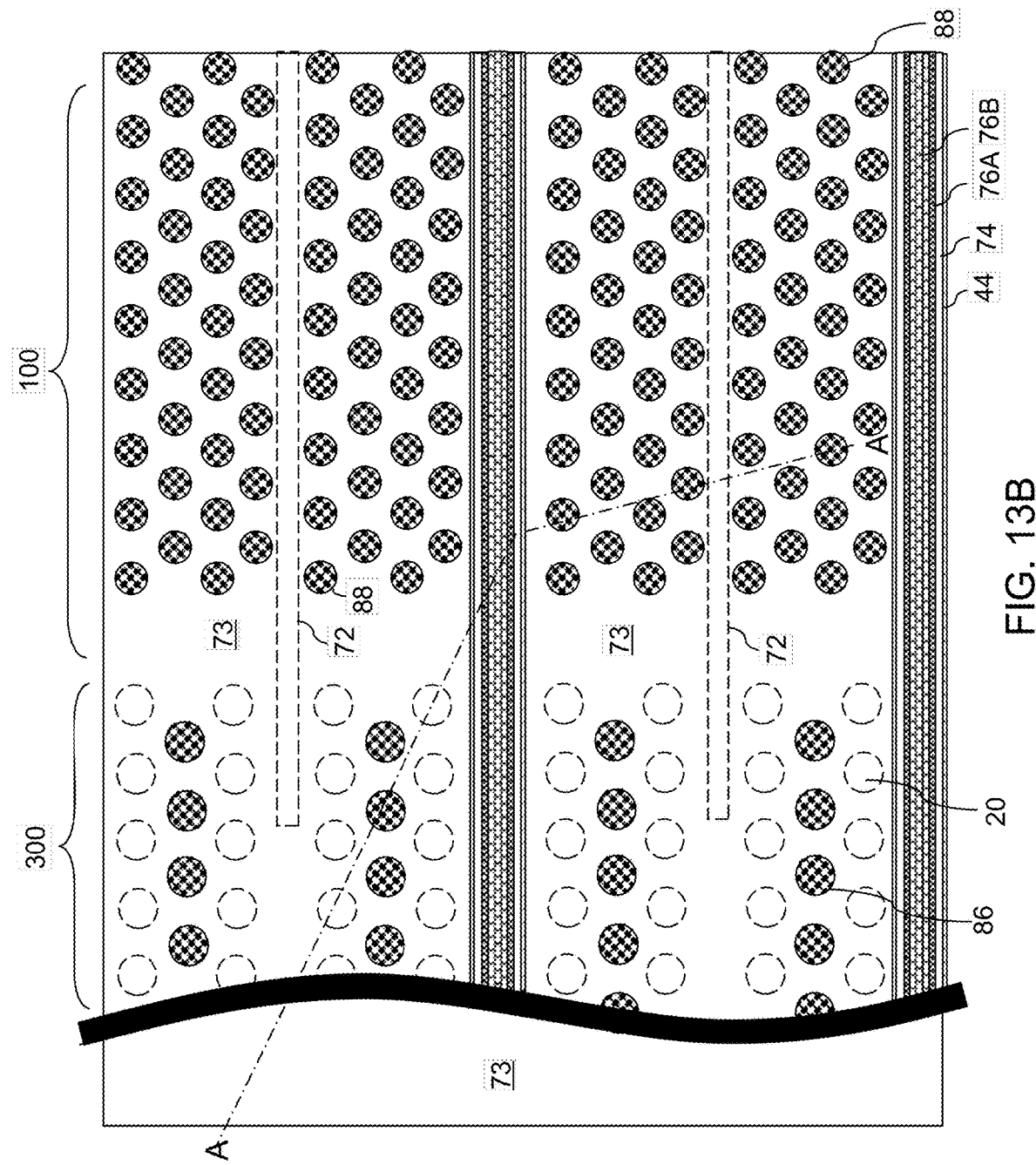
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65.

Figure 14:
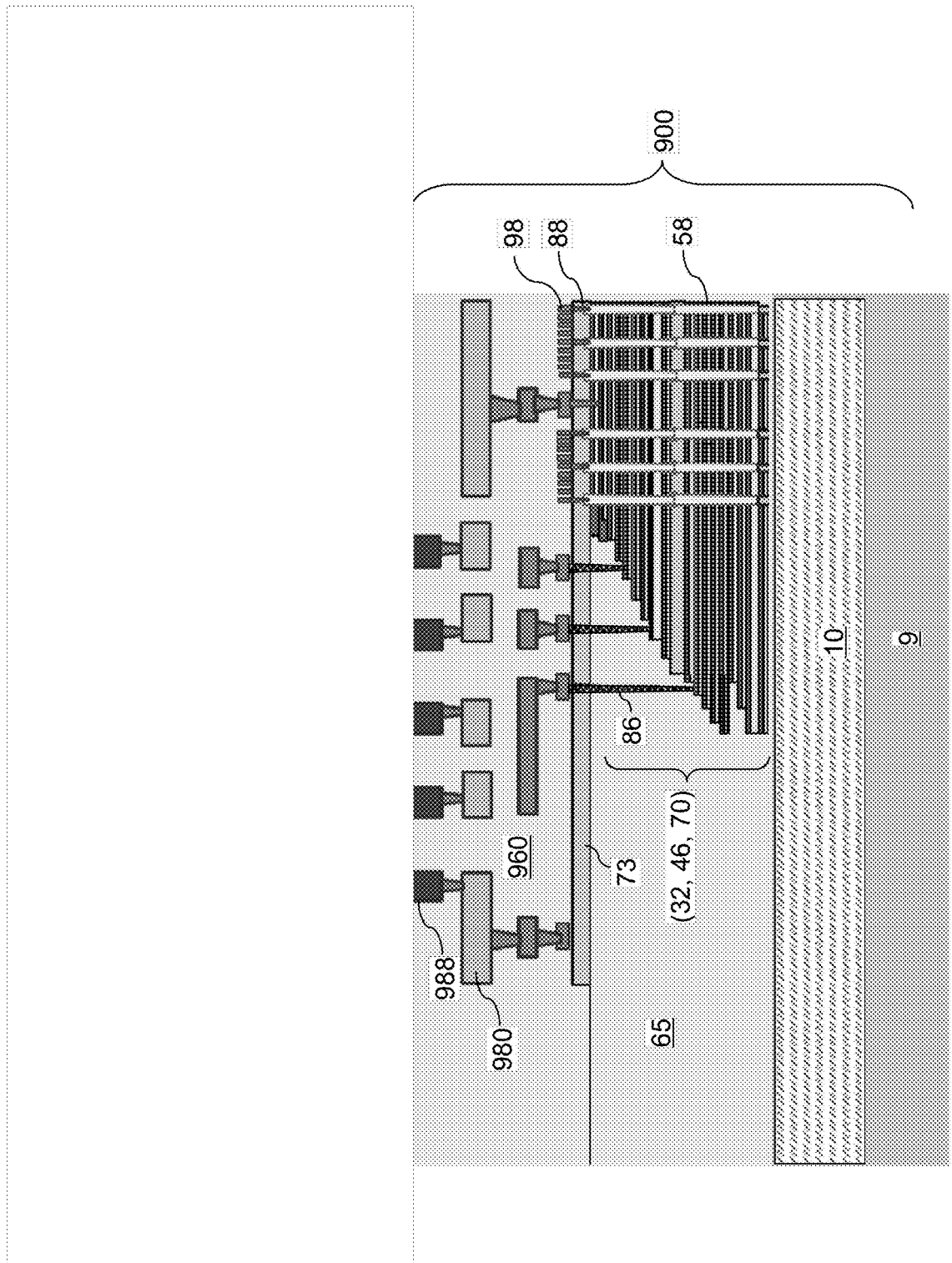
FIG. 14 is a vertical cross-sectional view of the exemplary structure after formation of a memory die including memory-side bonding pads.

Referring to FIG. 14, memory-side dielectric material layers 960 may be deposited over the contact level dielectric layer 73. Various memory-side metal interconnect structures 980 may be formed in the memory-side dielectric material layers 960. The memory-side metal interconnect structures 980 may include bit lines 98 that overlie the memory stack structures 55 and electrically connected to a respective subset of the drain regions 63. Further, the memory-side metal interconnect structures 980 may include additional metal via structures and additional metal line structures that provide electrical wiring to and from the various underlying elements such as the backside contact via structures 76, the word line contact via structures 86, the bit lines 98, and other nodes of the three-dimensional memory device that may be formed as needed. The thickness of the memory-side dielectric material layers 960 may be in a range from 300 nm to 3,000 nm, although lesser and greater thicknesses may also be used.

Pad cavities may be formed in the upper portion of the memory-side metal interconnect structures 980 such that a respective one of the memory-side metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape. A conductive material may be deposited in the pad cavities to form various memory-side bonding pads 988. The memory-side bonding pads 988 may be formed within memory-side dielectric material layers 960, which is formed over the alternating stack (32, 46). The memory-side bonding pads 988 may be electrically connected to nodes of the memory stack structures 55. In one embodiment, each bit line 98 may be electrically connected to a respective one of the memory-side bonding pads 988. The exemplary structure comprises a memory die 900.

Figure 15:
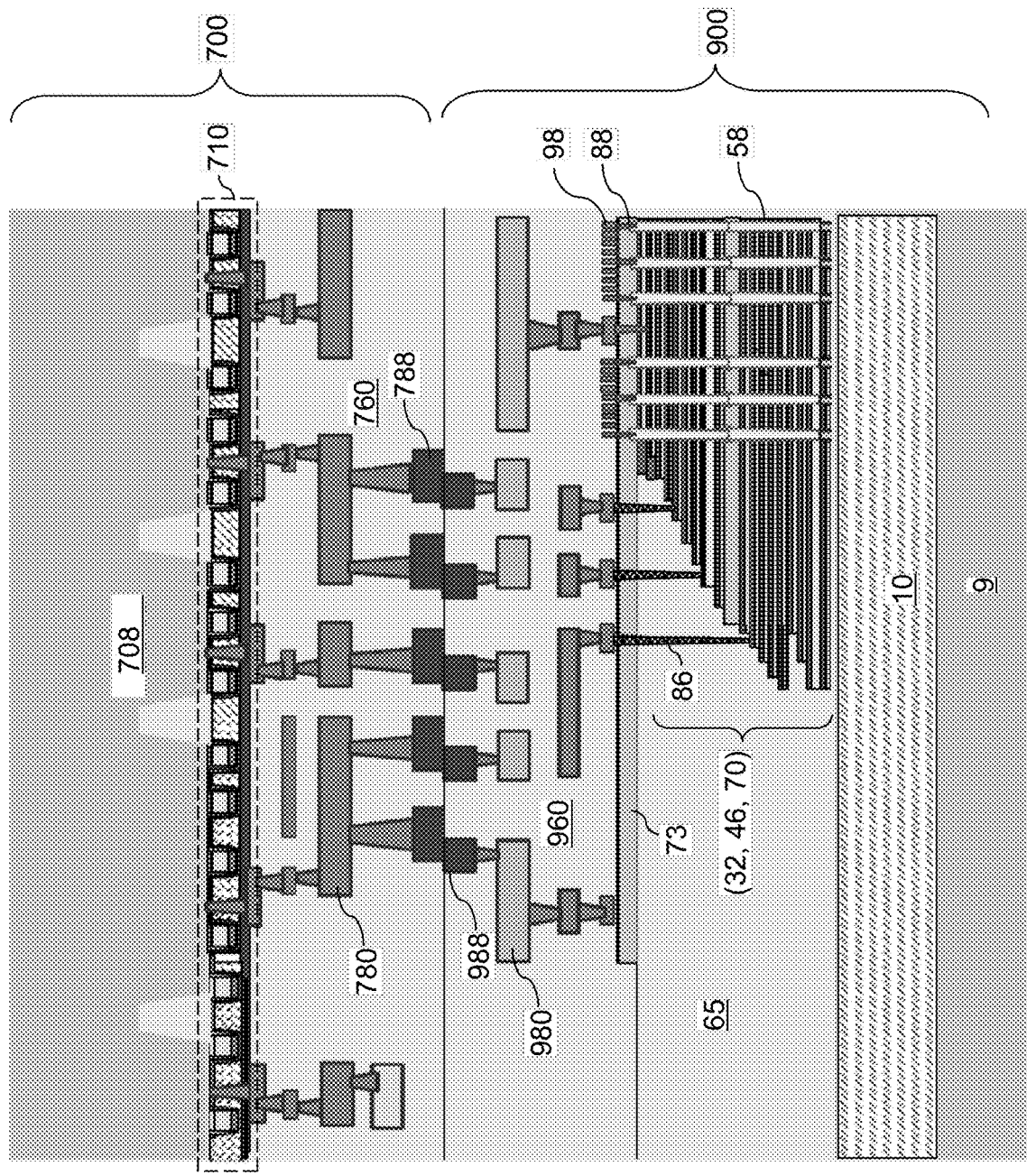
FIG. 15 is a vertical cross-sectional view of the exemplary structure after bonding a support die to the memory die according to an embodiment of the present disclosure.

Referring to FIG. 15, a support die 700 is provided, which comprises various semiconductor devices 710 formed on a support-die substrate 708. The support-die substrate 708 may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The semiconductor devices 710 includes a peripheral circuitry configured to control operation of memory elements in the memory stack structures 55 in the memory die 900. The peripheral circuitry may include a word line driver that drives word lines of the three-dimensional memory array (comprising the electrically conductive layers 46) within the memory die 900, a bit line driver that drives the bit lines 98 in the memory die 900, a word line decoder circuit that decodes the addresses for the electrically conductive layers 46, a bit line decoder circuit that decodes the addresses for the bit lines 98, a sense amplifier circuit that senses the states of memory elements within the memory stack structures 55 in the memory die 900, a source power supply circuit that provides power to source regions 61 the memory die 900, a data buffer and/or latch, or any other semiconductor circuit that may be used to operate the array of memory stack structures 55 in the memory die 900.

The various semiconductor devices 710 may include field effect transistors, which include respective transistor active regions (i.e., source regions and drain regions), a channel, and a gate structure. The field effect transistors may be arranged in a CMOS configuration. Dielectric material layers are formed over the semiconductor devices 710, which are herein referred to as support-side dielectric material layers 760. Support-side metal interconnect structures 780 may be formed within the support-side dielectric material layers 760. The support-side metal interconnect structures 780 may include various device contact via structures (e.g., source and drain electrodes which contact the respective source and drain nodes of the device or gate electrode contacts), interconnect-level metal line structures, interconnect-level metal via structures, and support-side bonding pads 788. The support-side bonding pads 788 may be formed in support-side dielectric material layers 760, and are electrically connected to nodes of the peripheral circuitry. The support-side bonding pads 788 are configured to mate with the memory-side bonding pads 988 of a memory die 900 to provide electrically conductive paths between the memory die 900 and the support die 700.

Figure 16:
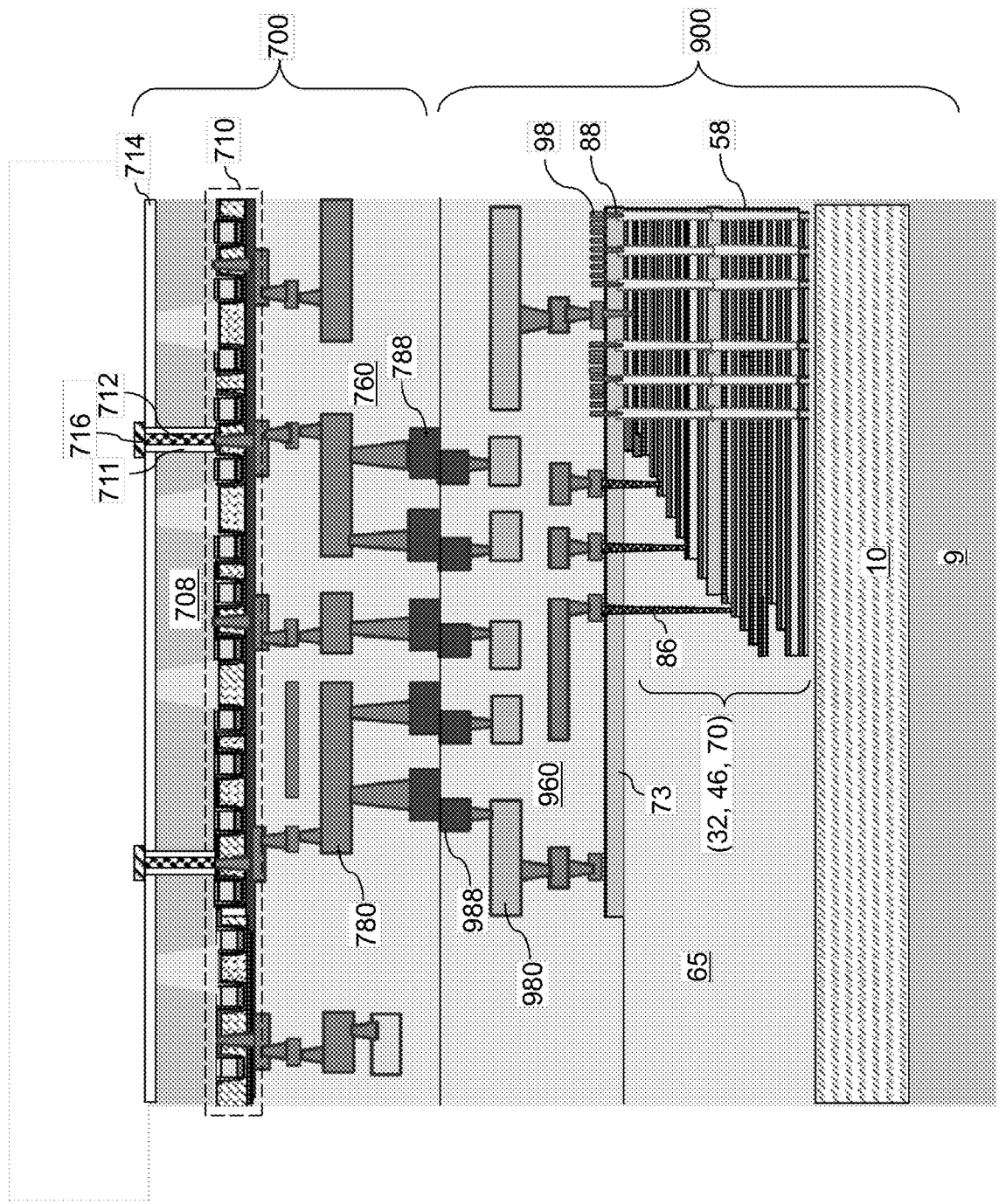
FIG. 16 is a vertical cross-sectional view of the exemplary structure after thinning the support die and forming external bonding pads according to an embodiment of the present disclosure.

Referring to FIG. 16, an exemplary bonded assembly according to an embodiment of the present disclosure is illustrated, which may be formed by bonding the memory-side bonding pads 988 of the memory die 900 to the support-side bonding pads 788 of the support die 700. Metal-to-metal bonding may be used to bond the memory die 900 to the support die 700.

The support-die substrate 708 may be thinned, for example, by grinding, chemical etching, polishing, or a combination thereof. The thickness of the support-die substrate 708 as thinned may be in a range from 0.5 micron to 5 microns, although lesser and greater thicknesses may also be used. A backside insulating layer 714 may be formed on the backside surface of the support-die substrate 708. The backside insulating layer 714 includes an insulating material such as silicon oxide, and may have a thickness in a range from 30 nm to 600 nm, although lesser and greater thicknesses may also be used. Through-substrate via cavities may be formed through the support-die substrate 708. An insulating spacer 711 and a through-substrate conductive via structure 712 may be formed in each of the substrate via cavities. An external bonding pad 716 may be formed on each through-substrate contact via structure 712. A solder ball (not shown) may be applied to each external bonding pad 716, and a bonding wire (not shown) may be attached to each solder ball.

Referring to all drawings and according to various embodiments of the present disclosure, a semiconductor structure comprising a memory die 900 bonded to a support die 700 containing peripheral circuitry is provided. The memory die 900 comprises: an alternating stack of insulating layers 32 and electrically conductive layers 46 located over a substrate (9, 10) including a single crystalline substrate semiconductor material; memory stack structures 55 extending through the alternating stack (32, 46) and comprising a respective memory film 50 and a respective vertical semiconductor channel 60 including a single crystalline channel semiconductor material.

In one embodiment, the memory die 900 comprises memory-side bonding pads 988 formed within memory-side dielectric material layers 960 that overlie the alternating stack (32, 46) and electrically connected to nodes of the memory stack structures 55. In one embodiment, the support die 700 comprises support-side bonding pads 788 formed within support-side dielectric material layers 760, electrically connected to nodes of the peripheral circuitry, and bonded to the memory-side bonding pads 988.

In one embodiment, a crystallographic orientation of the single crystalline channel semiconductor material and a crystallographic orientation of the single crystalline substrate semiconductor material that have a same Miller index are parallel to one other for each respective Miller index. The memory die 900 comprises epitaxial pedestal channels 11 comprising a respective single crystalline pillar semiconductor material in epitaxial alignment with the single crystalline substrate semiconductor material and with the single crystalline channel semiconductor material of an overlying one of the vertical semiconductor channels 60.

In one embodiment, the memory die 900 comprises drain regions 63 comprising a single crystalline drain semiconductor material in epitaxial alignment with the single crystalline channel semiconductor material of an underlying one of the vertical semiconductor channels 60. In one embodiment, the single crystalline channel semiconductor material and the single crystalline pillar semiconductor material includes dopants of a first conductivity type at a first atomic concentration, and the single crystalline drain semiconductor material includes dopants of a second conductivity type that is an opposite of the first conductivity type at a second atomic concentration that is greater than the first atomic concentration.

In one embodiment, the memory die 900 comprises a source region 61 formed within the single crystalline substrate semiconductor material of the substrate (9, 10) and having a doping of the second conductivity type, and a backside contact via structure 76 extending through the alternating stack (32, 46) and contacting the source region 61. The single crystalline substrate semiconductor material of the substrate (9, 10) has a doping of the first conductivity type. In one embodiment, the memory die 900 comprises bit lines 98 that overlie the memory stack structures 55 and electrically connected to a respective subset of the drain regions 63 and electrically connected to a respective one of the memory-side bonding pads 988.

In one embodiment, each of the memory films 50 laterally surrounds, and contacts, a respective one of the vertical semiconductor channels 60, and overlies, and contacts, a respective one of the epitaxial pedestal channels 11.

In one embodiment, each of the memory films 50 comprises: a cylindrical portion that contacts sidewalls of the insulating layers 32 within the alternating stack (32, 46), and an annular portion that adjoins a bottom end of the cylindrical portion. One of the vertical semiconductor channels 60 extends through an opening through the annular portion. In one embodiment, a top surface of the annular portion contacts an annular bottom surface of the one of the vertical semiconductor channels 60, a bottom surface of the annular portion contacts a top surface of an underlying one of the epitaxial pedestal channels 11. In one embodiment, an entire bottom surface of each of the drain regions 63 contacts an entire top surface of an underlying one of the vertical semiconductor channels 60.

In one embodiment, each of the memory films 50 comprises a charge storage layer 54 comprising a charge trapping material and vertically extending through the alternating stack (32, 46) as a continuous material layer, and a tunneling dielectric layer 56 contacting an inner sidewall of the charge storage layer 54 and laterally surrounding, and contacting, a respective one of the vertical semiconductor channels 60.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46) to provide stepped surfaces, a retro-stepped dielectric material portion 65 overlying the stepped surfaces, and contact via structures (such as word line contact via structure 86) extending through the retro-stepped dielectric material portion 65 and contacting a respective one of the electrically conductive layers 46.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion (such as a vertical semiconductor channel 60) of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

The vertical semiconductor channels 60 of the memory die 900 include the single crystalline semiconductor channel material, which provides enhanced charge carrier mobility compared to polycrystalline semiconductor channel materials known in the art. The enhanced charge carrier mobility increases the on-current of the vertical semiconductor channels 60, and provides stacking of a greater number of electrically conductive layers 46 as word lines, thereby increasing the device density in a three-dimensional memory device. The single crystalline channel semiconductor material may also be formed by a high rate CVD epitaxial growth process at a relatively high temperature without damaging the peripheral circuitry transistors because the peripheral circuitry is formed on a separate support die and bonded to the memory die after formation of the vertical semiconductor channels.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die bonded to a support die, wherein:
   the memory die comprises an alternating stack of insulating layers and electrically conductive layers located over a substrate including a single crystalline substrate semiconductor material, and memory stack structures extending through the alternating stack and comprising a respective memory film and a respective vertical semiconductor channel including a single crystalline channel semiconductor material; and
   the support die comprises a peripheral circuitry,
   wherein:
   top and bottom electrically conductive layers in the alternating stack comprise drain and source select gate electrodes; and
   the single crystalline channel material vertically extends through the top electrically conductive layer in the alternating stack which comprises the drain select gate electrode.

2. The semiconductor structure of claim 1, wherein:
   the memory die further comprises memory-side bonding pads formed within memory-side dielectric material layers that overlie the alternating stack and electrically connected to nodes of the memory stack structures; and
   the support die further comprises support-side bonding pads formed within support-side dielectric material layers, electrically connected to nodes of the peripheral circuitry and bonded to the memory-side bonding pads.

3. The semiconductor structure of claim 1, wherein:
the single crystalline channel semiconductor material comprises single crystal silicon;
a crystallographic orientation of the single crystalline channel semiconductor material and a crystallographic orientation of the single crystalline substrate semiconductor material having a same Miller index are parallel to one other for each respective Miller index; and
the memory die comprises epitaxial pedestal channels comprising a respective single crystalline pillar semiconductor material in epitaxial alignment with the single crystalline substrate semiconductor material and with the single crystalline channel semiconductor material of an overlying one of the vertical semiconductor channels.

4. The semiconductor structure of claim 3, wherein the memory die further comprises drain regions comprising a single crystalline drain semiconductor material in epitaxial alignment with the single crystalline channel semiconductor material of an underlying one of the vertical semiconductor channels.

5. The semiconductor structure of claim 4, wherein the memory die further comprises bit lines that overlie the memory stack structures and electrically connected to a respective subset of the drain regions and electrically connected to a respective one of the memory-side bonding pads.

6. The semiconductor structure of claim 3, wherein each of the memory films laterally surrounds, and contacts, a respective one of the vertical semiconductor channels, and overlies, and contacts, a respective one of the epitaxial pedestal channels.

7. The semiconductor structure of claim 6, wherein each of the memory films comprises:
a cylindrical portion that contacts sidewalls of the insulating layers within the alternating stack; and
an annular portion that adjoins a bottom end of the cylindrical portion, wherein one of the vertical semiconductor channels extends through an opening through the annular portion.

8. The semiconductor structure of claim 7, wherein:
a top surface of the annular portion contacts an annular bottom surface of the one of the vertical semiconductor channels; and
a bottom surface of the annular portion contacts a top surface of an underlying one of the epitaxial pedestal channels.

9. The semiconductor structure of claim 4, wherein an entire bottom surface of each of the drain regions contacts an entire top surface of an underlying one of the vertical semiconductor channels.

10. The semiconductor structure of claim 1, wherein each of the memory films comprises:
a charge storage layer comprising a charge trapping material and vertically extending through the alternating stack as a continuous material layer; and
a tunneling dielectric layer contacting an inner sidewall of the charge storage layer and laterally surrounding, and contacting, a respective one of the vertical semiconductor channels.

11. The semiconductor structure of claim 1, further comprising:
a terrace region in which each electrically conductive layer other than a topmost electrically conductive layer within the alternating stack laterally extends farther than any overlying electrically conductive layer within the alternating stack to provide stepped surfaces;
a retro-stepped dielectric material portion overlying the stepped surfaces; and
contact via structures extending through the retro-stepped dielectric material portion and contacting a respective one of the electrically conductive layers.

12. The semiconductor structure of claim 1, wherein the single crystalline channel semiconductor material comprises single crystal silicon.

13. The semiconductor structure of claim 1, wherein a crystallographic orientation of the single crystalline channel semiconductor material and a crystallographic orientation of the single crystalline substrate semiconductor material having a same Miller index are parallel to each other for each respective Miller index.

14. The semiconductor structure of claim 4, wherein the drain regions consist of the single crystalline drain semiconductor material.

15. The semiconductor structure of claim 4, wherein:
the vertical semiconductor channels have doping of a first conductivity type; and
the drain regions have a doping of a second conductivity type that is an opposite of the first conductivity type.

16. The semiconductor structure of claim 10, wherein each of the memory films comprises a blocking dielectric layer contacting, and laterally surrounding, the charge storage layer.

* * * * *